United States Patent
Kim et al.

(10) Patent No.: US 9,704,571 B2
(45) Date of Patent: Jul. 11, 2017

(54) MEMORY DEVICE AND A METHOD OF OPERATING THE SAME

(71) Applicant: SAMSUNG ELECTRONICS CO., LTD., Suwon-si, Gyeonggi-do (KR)

(72) Inventors: Do-Kyun Kim, Seongnam-si (KR); Dong-Yang Lee, Yongin-si (KR); Kwang-Hyun Kim, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/209,126

(22) Filed: Jul. 13, 2016

(65) Prior Publication Data

US 2017/0047113 A1    Feb. 16, 2017

(30) Foreign Application Priority Data

Aug. 11, 2015    (KR) .................. 10-2015-0113374

(51) Int. Cl.
*G11C 11/24* (2006.01)
*G11C 11/56* (2006.01)
*G11C 11/4096* (2006.01)
*G11C 11/4094* (2006.01)
*G11C 11/4091* (2006.01)

(52) U.S. Cl.
CPC ........ *G11C 11/565* (2013.01); *G11C 11/4091* (2013.01); *G11C 11/4094* (2013.01); *G11C 11/4096* (2013.01)

(58) Field of Classification Search
CPC .................................................. G11C 11/565

USPC ....................................................... 365/149
See application file for complete search history.

(56) References Cited

U.S. PATENT DOCUMENTS

| | | | |
|---|---|---|---|
| 6,151,260 A | 11/2000 | Birk | |
| 6,625,075 B2 | 9/2003 | Birk | |
| 7,307,877 B2 | 12/2007 | Knoedgen | |
| 7,733,707 B2 | 6/2010 | Kang | |
| 7,952,921 B2 | 5/2011 | Kang | |
| 8,559,256 B2 | 10/2013 | Kim | |
| 8,717,802 B2 | 5/2014 | Lam et al. | |
| 8,773,925 B2 | 7/2014 | Koya et al. | |
| 2017/0046210 A1* | 2/2017 | Yim | G06F 11/076 |

FOREIGN PATENT DOCUMENTS

| | | |
|---|---|---|
| KR | 10-0800156 | 1/2008 |
| KR | 10-0844946 | 7/2008 |
| KR | 1020120126434 | 11/2012 |

* cited by examiner

*Primary Examiner* — Hoai V Ho
(74) *Attorney, Agent, or Firm* — F. Chau & Associates, LLC

(57) ABSTRACT

A method of operating a memory device includes writing cell data having one of at least three states to a memory cell; amplifying a voltage level of a bit line connected to the memory cell; determining that the cell data is in a first state when the voltage level of the bit line sensed at a sensing point is equal to or greater than a first reference voltage; determining that the cell data is in a second state when the voltage level of the bit line sensed at the sensing point is equal to or less than a second reference voltage which has a lower voltage level than the first reference voltage; and determining that the cell data is in a third state when the cell data is not in the first or second states.

16 Claims, 27 Drawing Sheets

| CD(BL) | CDB(BLB) | CCD[1:0] |
|---|---|---|
| 1 (VCC) | 0 (VSS) | 10 |
| 0 (VSS) | 1 (VCC) | 01 |
| X (1/2VCC) | X (1/2VCC) | 00 |

MEMORY DEVICE AND A METHOD OF OPERATING THE SAME

CROSS-REFERENCE TO RELATED APPLICATION

This application claims priority under 35 U.S.C. §119 to Korean Patent Application No. 10-2015-0113374, filed on Aug. 11, 2015, in the Korean Intellectual Property Office, the disclosure of which is incorporated by reference herein in its entirety.

TECHNICAL FIELD

The inventive concept relates to a semiconductor memory device, and more particularly, to a memory device for storing multi-level data and a method of operating the memory device.

DISCUSSION OF RELATED ART

Information communication devices that have multiple functions employ memory devices that have a large capacity and a high integration degree. One example of such a memory device is a dynamic random access memory (DRAM). In a DRAM, data is written to a memory cell using a charge stored in a capacitor. By adjusting an amount of charges stored in the capacitor, multi-level data may be stored in a memory cell. Thus, a storage capacity of the memory device may be increased.

SUMMARY

According to an exemplary embodiment of the inventive concept, there is provided a method of operating a memory device, the method including: writing cell data having one of at least three states to a memory cell; amplifying a voltage level of a bit line connected to the memory cell; determining that the cell data is in a first state when the voltage level of the bit line sensed at a sensing point is equal to or greater than a first reference voltage; determining that the cell data is in a second state when the voltage level of the bit line sensed at the sensing point is equal to or less than a second reference voltage lower than the first reference voltage and determining that the cell data is in a third state when the cell data is not in the first or second states.

The third state may be between the first state and the second state.

The method may further include applying a first voltage to the bit line when the cell data is in the third state.

The method may further include applying a precharge voltage to the bit line before amplifying the voltage level of the bit line, wherein the first voltage is the precharge voltage.

The method may further include sensing the voltage level of the bit line by comparing at the sensing point the voltage level of the bit line with each of the first reference voltage and the second reference voltage.

The voltage level of the bit line connected to the memory cell may be amplified with a sense amplifier connected to the bit line, and at least one voltage level of the first reference voltage and the second reference voltage may correspond to a threshold voltage level used by the sense amplifier to perform the amplifying.

The method may further include stopping the amplifying when the cell data is in the third state.

The method may further include, after determining the state of the cell data, outputting the voltage level of the bit line as cell data read from the memory cell.

The method may further include converting the output cell data having one of at least three states into digital data having one of two states.

The method may further include converting M pieces of cell data (M is a natural number equal to or greater than 2) which are read from M memory cells, into N-bit digital data (N is a natural number greater than M).

The converting may include generating three-bit digital data based on a first piece of the M pieces of cell data and a second piece of the M pieces of cell data.

The method may further include, before writing the cell data, converting N-bit digital data received from outside of the memory device into M pieces of cell data (M is a natural number equal to or greater than 2, and N is a natural number greater than M).

The memory cell may include a capacitor and a switching element.

According to an exemplary embodiment of the inventive concept, there is provided a memory device including: a memory cell connected to a word line and a bit line and configured to have one of at least three states; a sense amplifier configured to sense and amplify a voltage difference between the bit line and a complementary bit line; a post-sensing circuit configured to sense, in response to an enable signal, a voltage level of the bit line based on a first reference voltage and a second reference voltage and generate a bit line charge signal based on a result of sensing; and a charging circuit configured to apply, in response to the bit line charge signal, a precharge voltage to the bit line.

When the voltage level of the bit line is less than the first reference voltage and greater than the second reference voltage at a sensing point, the post-sensing circuit may be further configured to determine that the cell data is in an intermediate state among the at least three states.

The post-sensing circuit may include: a first comparator configured to compare the first reference voltage with the amplified voltage; and a second comparator configured to compare the second reference voltage with the amplified voltage, wherein the post-sensing circuit is further configured to generate the bit line charge signal based on outputs of the first comparator and the second comparator.

The enable signal may be activated after a predetermined period of time after the amplifying by the sense amplifier is started.

The sense amplifier may be further configured to stop the amplifying in response to the sensing signal.

The memory device may further include an output circuit configured to output the voltage level of the bit line as cell data written to the memory cell, wherein the cell data has one of at least three voltages.

The at least three voltages may include a first power voltage, a second power voltage, and the precharge voltage, wherein the first power voltage and the second power voltage are driving voltages of the sense amplifier.

The memory device may further include a data converting circuit configured to convert the cell data into digital data.

The memory device may further include a data converting circuit configured to convert M pieces of cell data read from M memory cells (M is a natural number equal to or greater than 2) into N-bit digital data (N is a natural number greater than M).

According to an exemplary embodiment of the inventive concept, there is provided a method of operating a memory device, the method including: converting N-bit data into M pieces of cell data having one of at least three states (M is a natural number equal to or greater than 2, and N is a natural number greater than M); writing the M pieces of cell data into M memory cells; reading cell data from the M memory cells; and converting the read M pieces of cell data into the N-bit data.

The reading may include: amplifying a voltage level of a bit line by sensing and amplifying a voltage difference between the bit line connected to a memory cell and a complementary bit line; sensing the voltage level of the bit line, at a preset sensing point, based on a first reference voltage and a second reference voltage having a lower voltage level than the first reference voltage; determining that the cell data is in a high state among the at least three states when the voltage level of the bit line is equal to or less than the first reference voltage; determining that the cell data is in a low state among the at least three states when the voltage level of the bit line is equal to or less than the second reference voltage; and determining that the cell data is in an intermediate state among the at least three states; and outputting the voltage level of the bit line when the cell data is not in the high or low states.

The method may further include applying a precharge voltage to the bit line when the cell data is in the third state.

According to an exemplary embodiment of the inventive concept, there is provided a method of operating a memory device, the method comprising: writing cell data to a memory cell; amplifying a voltage level of a bit line connected to the memory cell; and sensing the voltage level of the bit line, wherein when the sensed voltage level is greater than a first reference voltage, the cell data is in a first state, when the sensed voltage level is less than a second reference voltage, the cell data is in a second state, and when the sensed voltage level is between the first and second reference voltages, the cell data is in a third state.

The first state may be a high state, the second state may be a low state and the third state may be between the first and second states.

The first state may be represented as '1', the second state may be represented as '0', and the third state may be represented as 'X'.

BRIEF DESCRIPTION OF THE DRAWINGS

The above and other features of the inventive concept will become more clearly understood by describing in detail exemplary embodiments thereof with reference to the accompanying drawings in which.

DETAILED DESCRIPTION OF THE EMBODIMENTS

Figure 1:
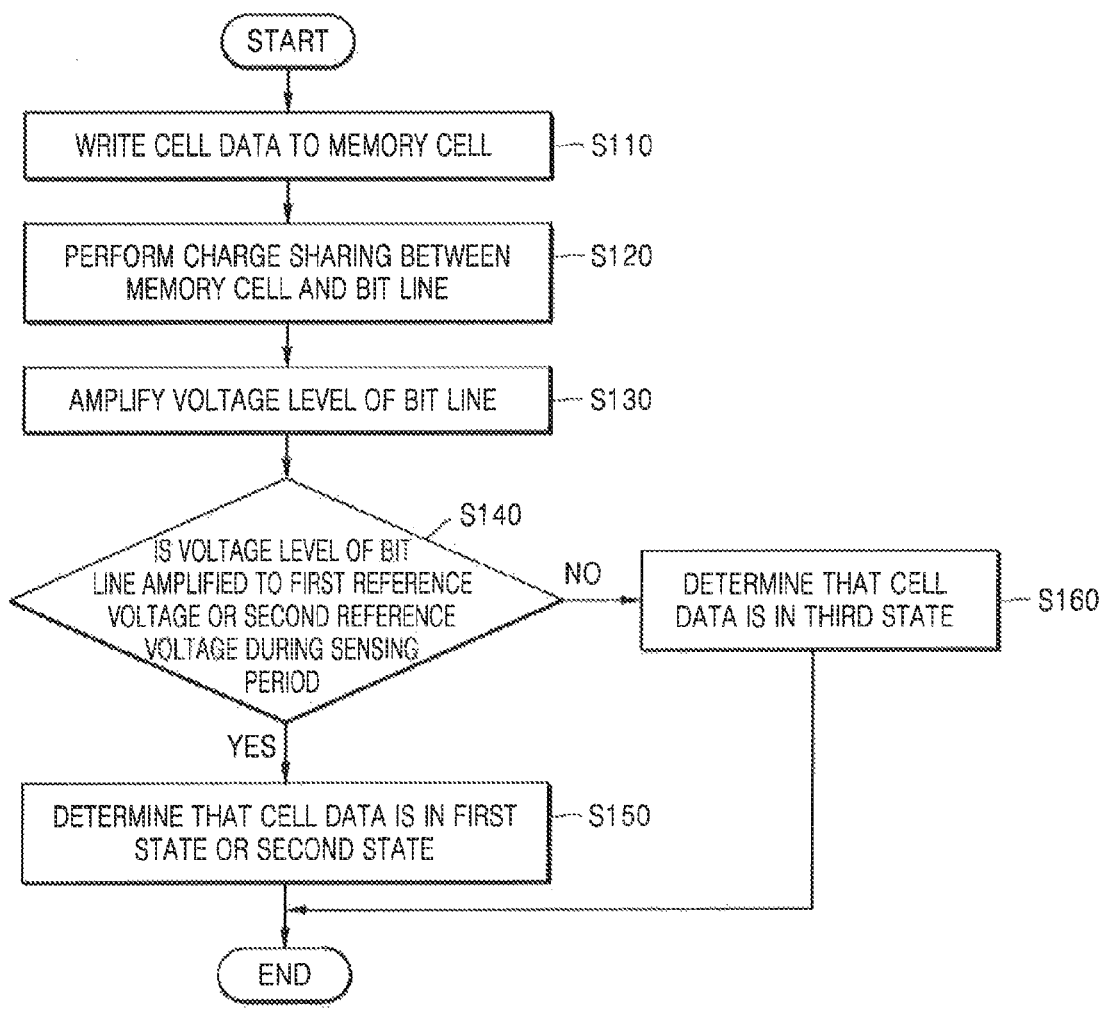
FIG. 1 is a flowchart of a method of operating a memory device according to an exemplary embodiment of the inventive concept.

Hereinafter, exemplary embodiments of the inventive concept will be described more fully with reference to the accompanying drawings. The inventive concept may, however, be embodied in many alternate forms and should not be construed as limited to only the embodiments set forth herein. Like reference numerals in the drawings may denote like elements.

In the present specification, when an element is "connected" or "coupled" to another element, it may be directly connected or coupled to the other element or intervening elements may be present.

An expression used in the singular encompasses the expression of the plural, unless the context clearly indicates otherwise.

FIG. 1 is a flowchart of a method of operating a memory device according to an exemplary embodiment of the inventive concept.

The memory device according to the present exemplary embodiment may store in a memory cell multi-level data having one of at least three states. A method of storing multi-level data having one of at least three states in a memory cell and reading the multi-level data from the memory cell will be described with reference to FIG. 1.

In operation S110, multi-level data having one of at least three states may be written to a memory cell. According to an exemplary embodiment of the inventive concept, multi-level data may have one of three states which are first through third states. The multi-level data written to a memory cell may be referred to as cell data. In each memory cell, one of cell data having the first state, cell data having the second state, and cell data having the third state may be written. The first state of the cell data is a highest state, and the second state of the cell data may be a lowest state. The third state of the cell data may be an intermediate state between the first state and the second state.

In operation S120, charge sharing may be performed between a memory cell and a bit line. After cell data is stored in the memory cell in operation S110, a bit line and a complementary bit line of the bit line may be precharged, and thus the bit line and the complementary bit line may have the same voltage level. The voltage level of the bit line may be varied by charge sharing and based on a state of cell data stored in the memory cell.

In operation S130, the voltage level of the bit line may be amplified. According to an exemplary embodiment of the inventive concept, the voltage level of the bit line may be amplified by using a bit line sense amplifier BLSA (see FIG. 2A) connected to the bit line and the complementary bit line. Here, the bit line sense amplifier BLSA senses and amplifies a voltage difference between the bit line and the complementary bit line. The voltage level of the bit line may be amplified up to a voltage level of power voltages applied to the bit line sense amplifier BLSA.

Next, the state of the cell data stored in the memory cell may be determined by sensing the voltage level of the bit line based on a first reference voltage and a second reference voltage which are preset. The first reference voltage may correspond to a first state of cell data, and the second reference voltage may correspond to a second state of the cell data. According to an exemplary embodiment of the inventive concept, a voltage level of the first reference voltage may be equal to or higher than a voltage level of a bit line after charge sharing, and a voltage level of the second reference voltage may be equal to or lower than a voltage level of a bit line after charge sharing.

In operation S140, whether the voltage level of the bit line is amplified to the first reference voltage or higher or to the second reference voltage or lower during a sensing period may be determined. According to an exemplary embodiment of the inventive concept, at a sensing point, this determining may be performed by comparing the voltage level of the bit line with each of the first reference voltage and the second reference voltage.

When the voltage level of the bit line is amplified to the first reference voltage or higher or to the second reference voltage or lower during a sensing period, the cell data may be determined to be in the first state or the second state in operation S150. In other words, when the voltage level of the bit line is equal to or higher than the first reference voltage or equal to or lower than the second reference voltage at a sensing point, the cell data may be determined to be in the first state or the second state. When the voltage level of the bit line is equal to or higher than the first reference voltage, the cell data may be determined to be in the first state. When the voltage level of the bit line is equal to or lower than the second reference voltage, the cell data may be determined to be in the second state.

If the voltage level of the bit line is not amplified to be equal to or higher than the first reference voltage or to be equal to or lower than the second reference voltage during a sensing period, the cell data may be determined to be in the third state in operation S160. In other words, when the voltage level of the bit line is lower than the first reference voltage and higher than the second reference voltage at a sensing point, the cell data may be determined to be in the third state.

As described above, the memory device according to the present exemplary embodiment may store cell data having one of at least three states and may read the cell data from the memory cell based on a variation speed of a voltage level of a bit line according to the cell data. For example, when reading the cell data from the memory cell, if the voltage level of the bit line reaches the first reference voltage or the second reference voltage during a preset sensing period, the cell data may be determined to be in the first state or the second state. In addition, when reading the cell data from the memory cell if the voltage level of the bit line has not reached the first reference voltage or the second reference voltage during the sensing period, the cell data may be determined to be in the third state.

The method of operating a memory device according to an exemplary embodiment of the inventive concept will be described in detail below with reference to FIGS. 2A and 2B.

Figure 2A:
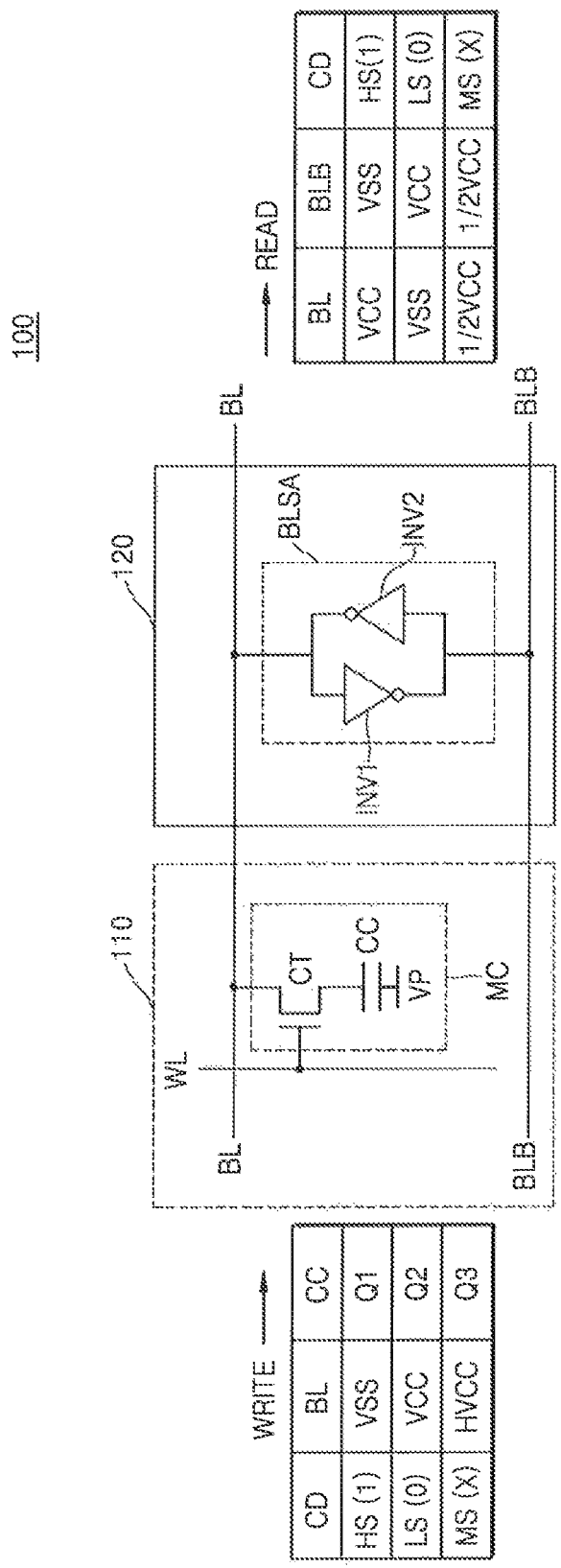
FIG. 2A is a flowchart of a method of operating a memory device according to an exemplary embodiment of the inventive concept.

FIG. 2A is a flowchart of a method of operating a memory device 100 according to an exemplary embodiment of the inventive concept.

Referring to FIG. 2A, the memory device 100 may include a memory cell array 110 and a sensing circuit 120.

The memory cell array 110 may include a plurality of word lines WL, a plurality of bit lines BL, and a plurality of memory cells MC arranged in areas where the word lines WL and the bit line BL cross each other. In FIG. 2A, only one memory cell MC connected to one word line WL and one bit line BL is illustrated for convenience of description.

The memory cell MC may include a cell capacitor CC for storing a charge corresponding to cell data CD and a switching element connecting the cell capacitor CC to the bit line BL. For example, the switching element may be a cell transistor CT. A gate of the cell transistor CT may be connected to the word line WL, and a drain of the cell transistor CT may be connected to the bit line BL. A first end of the cell capacitor CC may be connected to a source of the cell transistor CT, and a second end of the cell capacitor CC may be connected to a plate voltage VP.

The sensing circuit 120 may read cell data CD written to the memory cell MC by sensing a voltage level of the bit line BL. The voltage level of the bit line BL may be output as the cell data CD. According to an exemplary embodiment of the inventive concept, the sensing circuit 120 may be connected to the bit line BL and a complementary bit line BLB to sense a voltage difference between the bit line BL and the complementary bit line BLB, and may operate based on the sensed voltage difference. According to an exemplary embodiment of the inventive concept, the complementary bit line BLB may be a bit line to which another memory cell is connected. The complementary bit line BLB may also be a bit line to which a dummy memory cell is connected. The complementary bit line BLB may be arranged in parallel to the bit line BL.

The sensing circuit 120 may include a latch-type bit line sense amplifier BLSA including inverters INV1 and INV2. The bit line sense amplifier BLSA may operate based on a first power voltage VCC and a second power voltage VSS, and may amplify a voltage level of the bit line BL to a voltage level of the first power voltage VCC or a voltage level of the second power voltage VSS. The first power voltage VCC may be a power voltage received from the outside of the memory device 100 or may be a voltage generated in the memory device 100 based on a power voltage received from the outside thereof. The second power voltage VSS may be a voltage having a lower voltage level than the first power voltage VCC, and may be, for example, a ground voltage. Hereinafter, the voltage level of the first power voltage VCC will be referred to as VCC, and the voltage level of the second power voltage VSS may be referred to as VSS.

The bit line sense amplifier BLSA may perform an amplifying operation when a voltage difference between two applied inputs is equal to or greater than a predetermined threshold value. In other words, the bit line sense amplifier BLSA may perform an operation of amplifying the voltage difference when a voltage difference between the bit line BL and the complementary bit line BLB is equal to or greater than a predetermined threshold value. When the complementary bit line BLB has a constant voltage level, the bit line sense amplifier BLSA may perform an amplifying operation, based on the threshold value, only when a voltage level of the bit line BL is equal to or higher than a first threshold voltage or when a voltage level of the bit line BL is equal to or lower than a second threshold voltage that is lower than the first threshold voltage. The first threshold voltage may have a voltage level which is a sum of a voltage level of the complementary bit line BLB and the threshold value, and the second threshold voltage may have a voltage level corresponding to a voltage level of the complementary bit line BLB from which the threshold value is subtracted.

The threshold value may be determined based on physical characteristics of the bit line sense amplifier BLSA (for example, a threshold voltage of transistors included in the bit line sense amplifier BLSA), and the first threshold voltage and the second threshold voltage may be determined based on the threshold value and a voltage level of the complementary bit line BLB. For example, when the voltage level of the complementary bit line BLB is ½VCC, the first threshold voltage may have a voltage level between VCC and ½VCC. The second threshold voltage may have a voltage level between ½VCC and VSS.

When a voltage level of the bit line BL is equal to or higher than the first threshold voltage or equal to or lower than the second threshold voltage, the bit line sense amplifier BLSA may amplify the voltage level of the bit line BL to VCC or VSS. When the voltage level of the bit line BL is lower than the first threshold voltage and higher than the second threshold voltage, in other words, when a voltage difference between the bit line BL and the complementary bit line BLB is smaller than a threshold value, the bit line sense amplifier BLSA may not perform a normal amplifying operation. Thus, the voltage level of the bit line BL may not be amplified at all or may be amplified very slowly.

The memory device 100 according to the present exemplary embodiment may write multi-level data having one of at least three states, in other words, cell data CD, to the memory cell MC. In addition, the memory device 100 may distinguish a state of the multi-level data and read the multi-level data by using amplifying characteristics of the bit line sense amplifier BLSA described above.

Cell data CD is data stored in a memory cell MC, and may be data generated by converting digital data received from the outside of the memory device 100. The cell data CD may have one of three states HS, LS, and MS. The three states HS, LS, and MS may be respectively represented as '1', '0', and 'X'. When a word line enable voltage is applied to the word line WL, the cell transistor CT may be turned on, and when a voltage corresponding to the three states HS, LS, and MS of the cell data CD is applied to the bit line BL, charges respectively corresponding to the three states HS, LS, and MS of the cell data CD may be stored in the cell capacitor CC so that the cell data CD is written to the memory cell MC. According to an exemplary embodiment of the inventive concept, when cell data CD is in a first state HS, a relatively large amount of charges may be stored in the cell capacitor CC, when cell data CD is in a second state LS, a relatively small amount of charges may be stored in the cell capacitor CC, and when cell data CD is in a third state MS, charges of an intermediate amount (e.g., between the relatively large and small amounts) may be stored in the cell capacitor CC.

For example, when a first power voltage VCC is applied to the bit line BL, a first charge Q1 may be stored in the cell capacitor CC so that cell data CD of the first state HS is written to the memory cell MC. When a second power voltage VSS is applied to the bit line BL, a second charge Q2 may be stored in the cell capacitor CC so that cell data CD of the second state LS is written to the memory cell MC. In addition, when a third power voltage HVCC is applied to the bit line BL, a third charge Q3 may be stored in the cell capacitor CC so that cell data CD of the third state MS is written to the memory cell MC. A voltage level of the third power voltage HVCC may be ½VCC.

The cell data CD written to the memory cell MC may be read according to a process described below. After a writing operation on the memory cell MC is completed or before a reading operation on the memory cell MC is performed, the bit line BL or the complementary bit line BL may be precharged with a precharge voltage. A voltage level of the precharge voltage may be identical or similar to ½VCC. The third power voltage HVCC may be used as a precharge voltage.

When a word line enable voltage is applied to the word line WL, the cell transistor CT may be turned on, and charge sharing between the cell capacitor CC of the memory cell MC and the bit line BL may be performed. A voltage level of the bit line BL may be varied according to the cell data CD stored in the memory cell MC.

When the cell data CD is in the first state HS, a voltage level of the cell capacitor CC of the memory cell MC may be higher than the third power voltage HVCC. A voltage level of the bit line BL may be increased according to charge sharing and may be increased to be higher than the first threshold voltage of the bit line sense amplifier BLSA.

When the cell data CD is in the second state LS, a voltage level of the cell capacitor CC may be lower than the third power voltage HVCC. A voltage level of the bit line BL may be reduced according to charge sharing, and may be reduced to be lower than the second threshold voltage of the bit line sense amplifier BLSA.

When the cell data CD is in the third state MS, a voltage level of the cell capacitor CC may be identical or similar to a voltage level of the bit line BL. Since migration of charges between the cell capacitor CC and the bit line BL is very small, the voltage level of the bit line BL may not change or may be increased or reduced very slowly. Thus, it may take longer time for a voltage level of the bit line BL to reach the first threshold voltage or the second threshold voltage of the bit line sense amplifier BLSA when the cell data CD is in the third state MS than when the cell data CD is in the first state HS or the second state LS.

As described above, when a voltage level of the bit line BL is equal to or higher than the first threshold voltage, the bit line sense amplifier BLSA may amplify the voltage level of the bit line BL to VCC, and a voltage level of the complementary bit line BLB to VSS. When a voltage level of the bit line BL is equal to or lower than the second threshold voltage, the bit line sense amplifier BLSA may amplify the voltage level of the bit line BL to VSS, and a voltage level of the complementary bit line BLB to VCC. In addition, when a voltage level of the bit line BL is lower than the first threshold voltage and higher than the second threshold voltage, despite the amplifying operation of the bit line sense amplifier BLSA, the voltage levels of the bit line BL and the complementary bit line BLB may be maintained at a voltage level identical or similar to ½VCC.

Then, charge sharing between the memory cell MC and the bit line BL starts, and a voltage level of the bit line BL sensed after a predetermined period of time may be identical or similar to VCC or VSS when the cell data CD is in the first state HS or the second state LS. When the cell data CD is in the third state MS, the sensed voltage level of the bit line BL may be identical or similar to ½VCC.

As described above, the bit line BL may have one of three voltage levels according to cell data CD. Thus, the memory device 100 may determine cell data CD by sensing a voltage level of the bit line BL at a predetermined sensing point. When a voltage level of the bit line BL is equal to or higher than a first reference voltage at a sensing point, the memory device 100 may determine the cell data CD to be in the first state, and when the voltage level of the bit line BL is equal to or lower than a second reference voltage, the memory device 100 may determine the cell data CD to be in the second state. In addition, when a voltage level of the bit line BL is lower than the first reference voltage and higher than the second reference voltage at the sensing point, in other words, if a voltage level of the bit line BL has not reached the first reference voltage or the second reference voltage, the memory device 100 may determine the cell data CD to be in the third state. The first reference voltage may have a voltage level between VCC and ½VCC, and the second reference voltage may have a voltage level between ½VCC and VSS.

According to an exemplary embodiment of the inventive concept, when a voltage level of the bit line BL is lower than the first reference voltage and higher than the second reference voltage at the sensing point, in other words, when the cell data CD is in the third state, the memory device 100 may apply a precharge voltage to the bit line BL and the complementary bit line BLB. Thus, the voltage level of the bit line BL may be ½VCC.

Next, the memory device 100 may output the voltage level of the bit line BL as the cell data CD to read the cell data CD which is in one of the three states HS, LS, and MS.

As described above, the memory device 100 according to the present exemplary embodiment may easily read multi-level data by using a speed of a variation in a voltage level of the bit line BL according to a state of multi-level data, for example, cell data CD, and amplifying characteristics of the bit line sense amplifier BLSA. The memory device 100 may store and read multi-level data having one of at least three states in one memory cell, and thus a storage capacity of the memory device 100 may be increased.

Figure 2B:
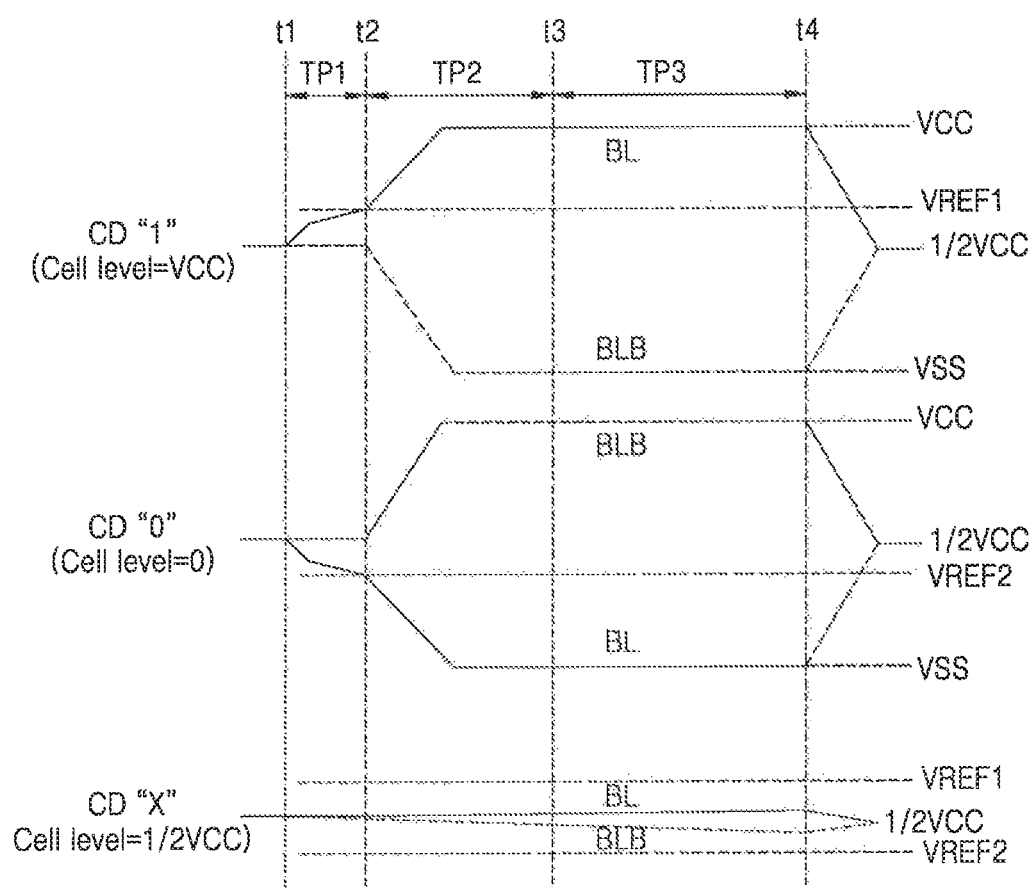
FIG. 2B is a graph showing voltage levels of a bit line and a complementary bit line of the memory device of FIG. 2A, according to an exemplary embodiment of the inventive concept.

FIG. 2B is a graph showing voltage levels of the bit line BL and the complementary bit line BLB of the memory device 100 of FIG. 2A, according to an exemplary embodiment of the inventive concept. FIG. 2B illustrates voltage levels of the bit line BL and the complementary bit line BLB according to cell data CD stored in the memory cell MC when the memory device 100 of FIG. 2A performs a reading operation.

Referring to FIG. 2B, charge sharing may be performed during a period TP1, an amplifying operation of the bit line sense amplifier BLSA may be performed during a period TP2, and an amplified voltage level of the bit line BL may be sensed and output during a period TP3.

Before a point t1 and after a point t4, in other words, before and after performing a reading operation, the bit line BL and the complementary bit line BLB may be precharged with a precharge voltage. Accordingly, voltage levels of the bit line BL and the complementary bit line BLB may be each ½ VCC.

When cell data CD is in the first state HS, a cell level, in other words, a voltage level of the cell capacitor CC, may be VCC. When a charge sharing operation starts at the point t1, charges move from the memory cell MC to the bit line BL, and a voltage level of the bit line BL may be increased. A voltage difference between the bit line BL and the complementary bit line BLB may be increased to be greater than a threshold value of the bit line sense amplifier BLSA.

When an amplifying operation of the bit line sense amplifier BLSA starts at a point t2, the voltage level of the bit line BL may be amplified to VCC, and the voltage level of the complementary bit line BLB may be amplified to VSS. After a point t3, for example, during the period TP3, the voltage level of the bit line BL, which is VCC, may be sensed and output. Since the voltage level of the bit line BL is higher than a first reference voltage VREF1, the cell data CD may be determined to be in the first state "1".

When the cell data CD is in the second state LS, a cell level, in other words, a voltage level of the cell capacitor CC may be VSS. When a charge sharing operation starts at the point t1, charges move from the bit line BL to the memory cell MC, and a voltage level of the bit line BL may be reduced. A voltage difference between the bit line BL and the complementary bit line BLB may be increased to be greater than a threshold value of the bit line sense amplifier BLSA.

When an amplifying operation of the bit line sense amplifier BLSA starts at the point t2, a voltage level of the bit line BL may be amplified to VSS, and a voltage level of the complementary bit line BLB may be amplified to VCC. After the point t3, for example, during the period TP3, the voltage level of the bit line BL, which is VSS, may be sensed and output. Since the voltage level of the bit line BL is lower than a second reference voltage VREF2, the cell data CD may be determined to be in the second state "0".

When the cell data CD is in the third state MS, a cell level may be ½VCC. Thus, when a charge sharing operation starts at the point t1, a voltage level of the bit line BL barely changes, and a voltage difference between the bit line BL and the complementary bit line BLB may be smaller than a threshold value of the bit line sense amplifier BLSA at the point t2. Accordingly, even though an amplifying operation of the bit line sense amplifier BLSA starts, the bit line BL or the complementary bit line BLB may not be amplified (or just very slightly), such that the voltage difference between the bit line BL and the complementary bit line BLB may be maintained at a level less than the threshold value of the bit line sense amplifier BLSA. After the point t3, for example, during the period TP3, a voltage level of the bit line BL that is identical or similar to ½VCC may be sensed and output. Since the voltage level of the bit line BL is lower than the first reference voltage VREF1 and higher than the second reference voltage VREF2, the cell data CD may be determined to be in the third state "X".

Figure 3:
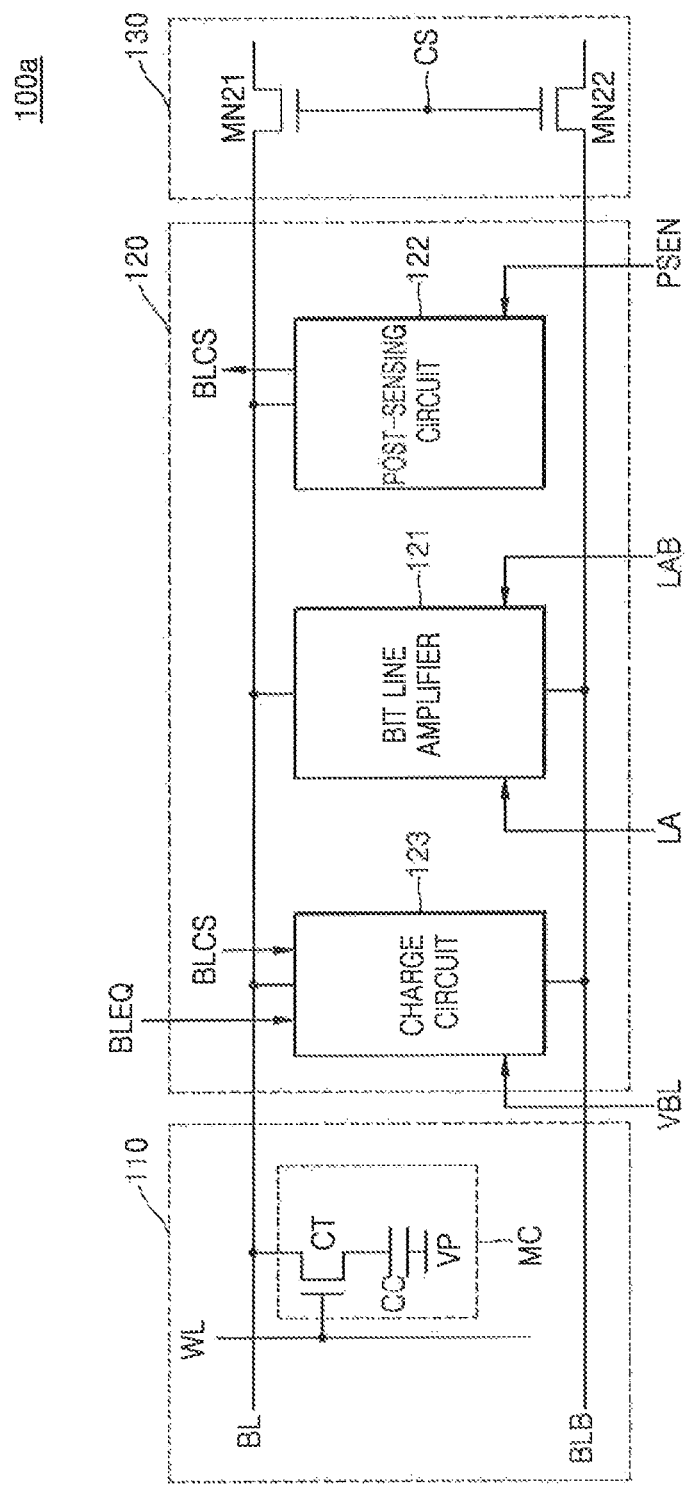
FIG. 3 is a block diagram illustrating a memory device according to an exemplary embodiment of the inventive concept.

FIG. 3 is a block diagram illustrating a memory device 100a according to an exemplary embodiment of the inventive concept.

Referring to FIG. 3, the memory device 100a may include a memory cell array 110, a sensing circuit 120, and an output circuit 130. A structure including the memory cell array 110, the sensing circuit 120, and the output circuit 130 may be referred to as a memory core.

The memory cell array 110 may include a plurality of memory cells MC, and each memory cell MC may store data. The memory cell array 110 and the memory cells MC have been described above with reference to FIG. 1, and thus a detailed description thereof will be omitted.

The sensing circuit 120 may include a bit line sense amplifier 121, a post-sensing circuit 122, and a charging circuit 123.

The bit line sense amplifier 121 may be connected between the bit line BL and the complementary bit line BLB, and may sense and amplify a voltage difference between the bit line BL and the complementary bit line BLB based on a driving voltage applied via a first power line LA and a second power line LAB. The bit line sense amplifier 121 may perform an amplifying operation when a first power voltage VCC and a second power voltage VSS are applied as driving voltages via the first power line LA and the second power line LAB.

The post-sensing circuit 122 may sense, in response to an enable signal PSEN, a voltage level of the bit line BL that is amplified by using the bit line sense amplifier 121 and generate a bit line charge signal BLCS (hereinafter referred to as a 'charge signal'). The post-sensing circuit 122 may sense a voltage level of the bit line BL based on a first reference voltage and a second reference voltage. A voltage level of the first reference voltage may be higher than ½VCC, and a voltage level of the second reference voltage may be lower than ½VCC. According to an exemplary embodiment of the inventive concept, the first reference voltage and the second reference voltage may be received from the outside of the sensing circuit 120, for example, from a power generator of the memory device 100a. According to an exemplary embodiment of the inventive concept, the first reference voltage and the second reference voltage may be generated inside the post-sensing circuit 122.

The charging circuit 123 may equalize the bit line BL and the complementary bit line BLB, and may precharge the bit line BL and the complementary bit line BLB with a precharge voltage VBL. According to an exemplary embodiment of the inventive concept, the charging circuit 123 may apply a precharge voltage VBL to the bit line BL and the complementary bit line BLB in response to an equalization signal BLEQ received from a control logic of the memory device 100 (FIG. 2A) or a charge signal BLCS received from the post-sensing circuit 122.

The output circuit 130 may output voltages of the bit line BL and the complementary bit line BLB in response to a selection signal CS. The output circuit 130 may include output transistors MN21 and MN22 that are respectively connected to the bit line BL and the complementary bit line BLB and output the voltages of the bit line BL and the complementary bit line BLB based on a selection signal CS.

When reading cell data of the memory cell MC, the charging circuit 123 may, in response to an equalization signal BLEQ, equalize the bit line BL and the complementary bit line BLB and precharge the bit line BL and the complementary bit line BLB. When a word line enable voltage is applied to the word line WL, a voltage difference may be generated between the bit line BL and the complementary bit line BLB by charge sharing between the bit line BL and the memory cell MC. The bit line sense amplifier 121 senses and amplifies the voltage difference between the bit line BL and the complementary bit line BLB, and the post-sensing circuit 122 may sense an amplified voltage level of the bit line BL.

The post-sensing circuit 122 may activate a charge signal BLCS if a voltage level of the bit line BL is in a predetermined first voltage range. The first voltage range may be a voltage range including a precharge voltage VBL. For example, a voltage range between a first reference voltage and a second reference voltage of the bit line sense amplifier 121 may be set as the first voltage range. When a voltage level of the bit line BL is in the first voltage range, the post-sensing circuit 122 may output a charge signal, and the charging circuit 123 may, in response to a sensing signal, apply a precharge voltage VBL to the bit line BL and the complementary bit line BLB. According to an exemplary embodiment of the inventive concept, the post-sensing circuit 122 may include an additional charging circuit, and may apply a precharge voltage VBL to the bit line BL based on a charge signal BLCS.

When cell data CD stored in the memory cell MC is in the third state MS, an amplified voltage level of the bit line BL may be lower than the first reference voltage and higher than the second reference voltage. In other words, the amplified voltage level of the bit line BL may be in the first voltage range. Accordingly, when cell data CD is in the third state MS, the post-sensing circuit 122 may output an activated charge signal BLCS, and a precharge voltage VBL may be applied to the bit line BL and the complementary bit line BLB. According to an exemplary embodiment of the inventive concept, when a voltage level of the bit line BL is in the first voltage range, an amplifying operation of the bit line sense amplifier 121 may be stopped. The bit line BL and the complementary bit line BLB may have a voltage level of the precharge voltage VBL.

When cell data CD is in the first state HS or the second state LS, the bit line sense amplifier 121 may amplify the bit line BL and the complementary bit line BLB to a first power voltage or a second power voltage. The bit line BL and the complementary bit line BLB may have a voltage level of the first power voltage or the second power voltage. Thus, an amplified voltage level of the bit line BL may be equal to or higher than the first reference voltage or equal to or lower than the second reference voltage.

Next, the output circuit 130 may output a voltage of the bit line BL and the complementary bit line BLB in response to the selection signal CS. The voltage level of the bit line BL may be output as cell data CD.

As described above, in the memory device 100a according to the present exemplary embodiment, the post-sensing circuit 122 may sense whether a voltage level of the bit line BL has reached the first reference voltage or the second reference voltage. If the voltage level of the bit line BL has not reached the first reference voltage or the second reference voltage, in other words, if the voltage level of the bit line BL is in the first voltage range, the cell data CD may be determined to be in the third state, and a precharge voltage VBL may be applied to the bit line BL and the complementary bit line BLB.

Accordingly, when the voltage level of the bit line BL has reached the first reference voltage at a sensing point, the memory device 100a may determine the cell data CD to be in the first state; and when the voltage level of the bit line BL has reached the second reference voltage at a sensing point, the memory device 100a may determine the cell data CD to be in the second state. In addition, when the voltage level of the bit line BL has not reached the first reference voltage or the second reference voltage at a sensing point, the memory device 100a may determine the cell data CD to be in the third state.

Figure 4:
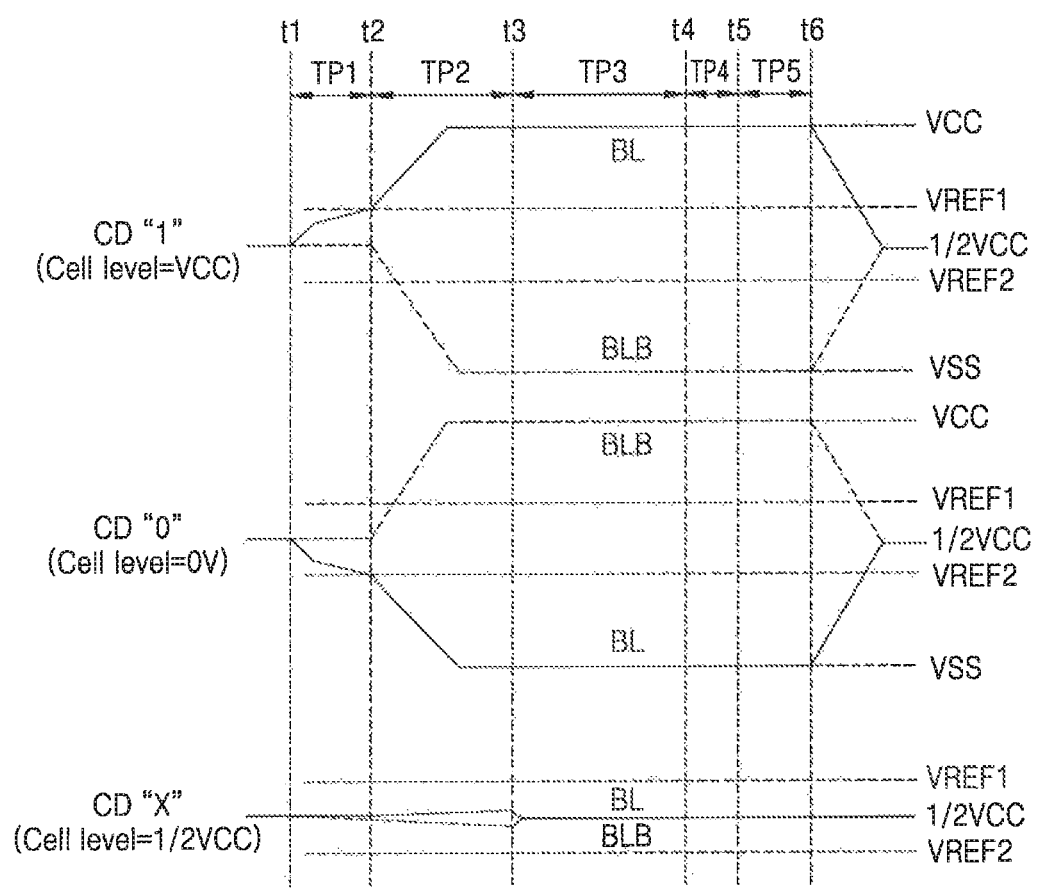
FIG. 4 is a graph showing voltage levels of a bit line and a complementary bit line of the memory device of FIG. 3, according to an exemplary embodiment of the inventive concept.

FIG. 4 is a graph showing voltage levels of the bit line BL and the complementary bit line BLB of the memory device 100a of FIG. 3, according to an exemplary embodiment of the inventive concept. FIG. 4 illustrates voltage levels of the bit line BL and the complementary bit line BLB according to cell data CD stored in the memory cell MC when the memory device 100a of FIG. 3 performs a reading operation.

Referring to FIG. 4, charge sharing may be performed during a period TP1, and an amplifying operation of the bit line sense amplifier BLSA may be performed during a period TP2. During a period TP3, an amplified voltage level of the bit line BL may be sensed and output, and a precharge voltage may be applied to the bit line BL and the complementary bit line BLB. A voltage of the bit line BL may be output during a period TP4.

Before a point t1, the charging circuit 123 may, in response to an equalization signal BLEQ, precharge the bit line BL and the complementary bit line BLB with a precharge voltage. The precharge voltage may be ½VCC. Accordingly, voltages of the bit line BL and the complementary bit line BLB may be precharged with ½VCC.

A charge sharing operation starts at the point t1. When cell data CD is in the first state "1", a voltage level of the bit line BL may be increased, and a voltage difference between the bit line BL and the complementary bit line BLB may be increased to be greater than a threshold voltage difference of the bit line sense amplifier BLSA. When cell data CD is in the second state "0", a voltage level of the bit line BL may be reduced, and a voltage difference between the bit line BL and the complementary bit line BLB may be increased to be greater than a threshold voltage difference of the bit line sense amplifier BLSA. When cell data CD is in the third state "X", a voltage level of the bit line BL barely changes, and a voltage difference between the bit line BL and the complementary bit line BLB may be smaller than a threshold voltage difference of the bit line sense amplifier BLSA.

When an amplifying operation of the bit line sense amplifier BLSA starts at the point t2, and when cell data CD is in the first state "1" or the second state "0," a voltage level of the bit line BL may be amplified to VCC or VSS. When cell data CD is in the third state "X," a voltage level of the bit line BL may barely change or change only very slightly compared to when the cell data CD is in the first state "1" or in the second state "0".

At the point t3, the post-sensing circuit 122 may compare the voltage level of the bit line BL with a first reference voltage VREF1 and a second reference voltage VREF2, and when the voltage level of the bit line BL is lower than the first reference voltage VREF1 and higher than the second reference voltage VREF2, the post-sensing circuit 122 may activate a charge signal BLCS. The first reference voltage VREF1 may be higher than ½VCC, and the second reference voltage VREF2 may be lower than ½VCC. According to an exemplary embodiment of the inventive concept, the first reference voltage VREF1 may be equal to or higher than a first threshold voltage of the bit line sense amplifier 121, and the second reference voltage VREF2 may be equal to or lower than a second threshold voltage of the bit line sense amplifier 121.

When cell data CD is in the first state "1", a voltage level of the bit line BL may be equal to or higher than the first reference voltage VREF1, and when cell data CD is in the second state "0", a voltage level of the bit line BL may be equal to or lower than the second reference voltage VREF2. When cell data CD is in the third state "X," a voltage level of the bit line BL may be lower than the first reference voltage VREF1 and higher than the second reference voltage VREF2. When the voltage level of the bit line BL is lower than the first reference voltage VREF1 and higher than the second reference voltage VREF2, the post-sensing circuit 122 may determine that the cell data CD is in the third state "X" and activate a charge signal BLCS. The charging circuit 123 may apply a precharge voltage VBL to the bit line BL and the complementary bit line BLB in response to the charge signal BLCS. Accordingly, the voltage level of the bit line BL may be ½VCC.

Since a selection signal CS is activated at a point t4, voltages of the bit line BL and the complementary bit line BLB may be output during the period TP4. After a predetermined period of time, at a point t6, the bit line BL and the complementary bit line BLB may be precharged again. The memory device 100a (FIG. 3) may determine a state of cell data CD stored in the memory cell MC based on a voltage level of the bit line BL or a combination of voltage levels of the bit line BL and the complementary bit line BLB, which is output at the point t4. When the voltage level of the bit line BL is VCC, the memory device 100a may determine that cell data CD is in the first state; when the voltage level of the bit line BL is VSS, the memory device 100a may determine that cell data CD is in the second state; when the voltage level of the bit line BL is ½VCC, the memory device 100a may determine that cell data CD is in the third state.

Figure 5:
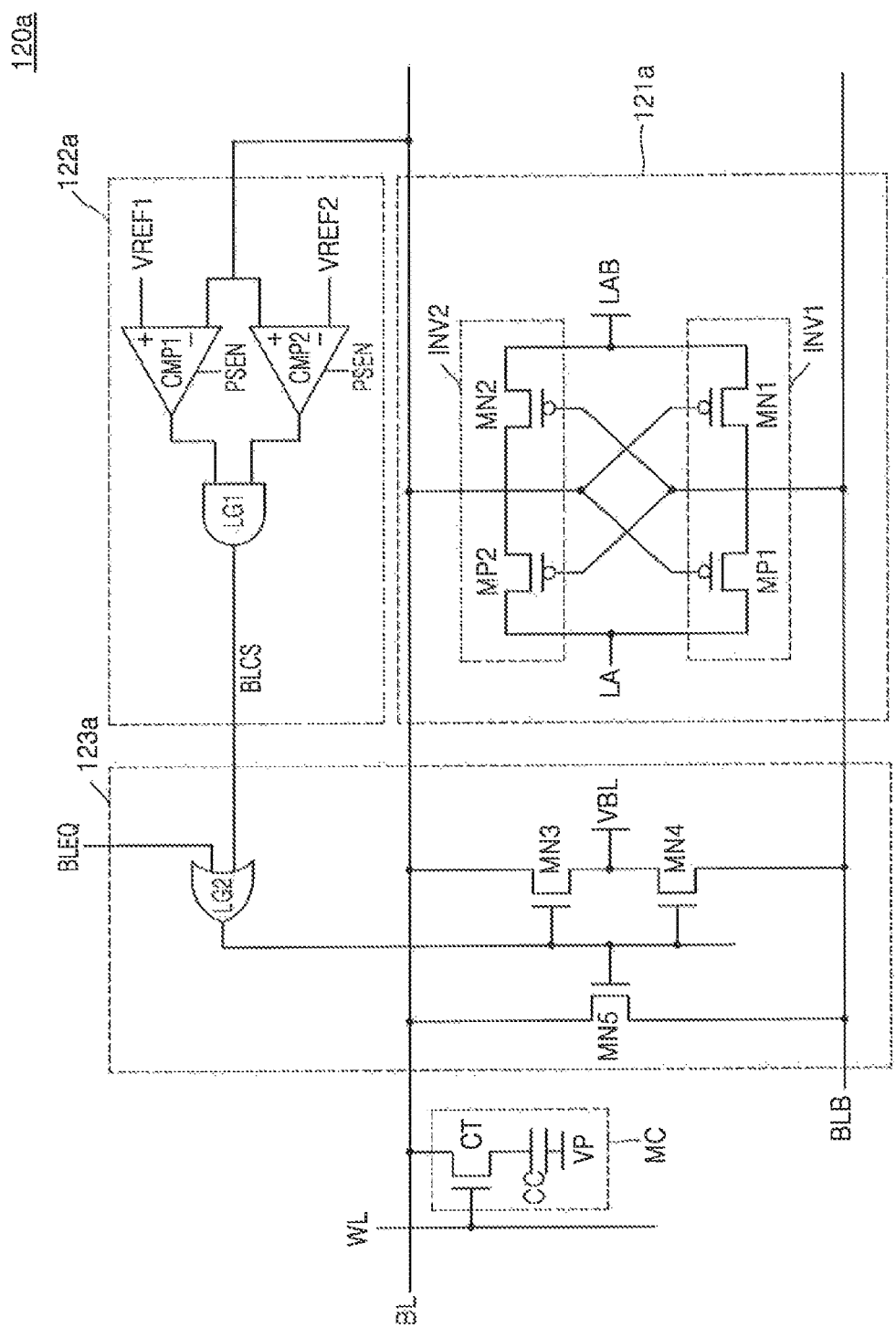
FIG. 5 is a circuit diagram of a sensing circuit according to an exemplary embodiment of the inventive concept.

FIG. 5 is a circuit diagram of a sensing circuit 120a according to an exemplary embodiment of the inventive concept. A memory cell MC is also illustrated for convenience of illustration.

Referring to FIG. 5, the sensing circuit 120a may include a bit line sense amplifier 121a, a post-sensing circuit 122a, and a charging circuit 123a.

The bit line sense amplifier 121a may include a first inverter INV1 and a second inverter INV2, and sense a voltage difference between a bit line BL and a complementary bit line BLB, and amplify the voltage difference. After a word line enable voltage is applied to the word line WL and charge sharing is performed between the memory cell MC and the bit line BL, driving voltages such as a first power voltage VCC and a second power voltage VSS may be applied to a first power line LA and a second power line LAB. The first inverter INV1 and the second inverter INV2 may perform an inverting operation based on the first power voltage VCC and the second power voltage VSS.

The first inverter INV1 may include a pair of transistors including a PMOS transistor MP1 and an NMOS transistor MN1, and may invert an input voltage received via the bit line BL and output the inverted voltage to the complementary bit line BLB.

The second inverter INV2 may include a pair of transistors including a PMOS transistor MP2 and an NMOS transistor MN2, and may invert an input voltage received via the complementary bit line BLB and output the inverted voltage to the bit line BL.

A voltage difference between the bit line BL and the complementary bit line BLB may be sensed and amplified via an inverting operation of the first inverter INV1 and the second inverter INV2. Voltage levels of the bit line BL and the complementary bit line BLB may be amplified to VCC or VSS.

Since inputs and outputs of the first inverter INV1 and the second inverter INV2 are in accordance with each other, when a voltage difference is generated between the bit line BL and the complementary bit line BLB, the first inverter INV1 and the second inverter INV2 may amplify the voltage difference between the bit line BL and the complementary bit line BLB by interacting with each other. If a voltage of the bit line BL is identical to that of the complementary bit line BLB, or if a voltage difference between the bit line BL and the complementary bit line BLB is less than a threshold value according to physical characteristics of the first inverter INV1 and the second inverter INV2 (for example, a mismatch between transistors), outputs of the first inverter INV1 and the second inverter INV2 may be the same or similar as each other, and thus the first inverter INV1 and the second inverter INV2 may not perform an inverting amplifying operation.

Before an amplifying operation of the bit line sense amplifier 121a is performed, a voltage level of the complementary bit line BLB may be ½VCC. When a voltage difference between the bit line BL and the complementary bit line BLB is equal to or higher than a threshold value, a voltage level of the bit line BL may be equal to or higher than a first threshold voltage or equal to or lower than a second threshold voltage. The first threshold voltage is higher than ½VCC, and the second threshold voltage is lower than ½VCC. When a voltage level of the bit line BL is lower than the first threshold voltage and higher than the second threshold voltage, a voltage difference between the bit line BL and the complementary bit line BLB may be less than a threshold value such that the first inverter INV1 and the second inverter INV2 may not perform an inverting amplifying operation. Accordingly, voltage levels of the bit line BL and the complementary bit line BLB may be identical or similar to ½VCC.

The post-sensing circuit 122a may include a first comparator CMP1, a second comparator CMP2, and a first logic gate LG1. The post-sensing circuit 122a may operate in response to an enable signal PSEN. The enable signal PSEN may be activated after a predetermined period of time after a driving voltage is applied to the bit line sense amplifier 121a, in other words, at a sensing point.

The first comparator CMP1 may, in response to the activated enable signal PSEN, compare the first reference voltage VREF1 and a voltage of the bit line BL, and output a comparison result. When the voltage of the bit line BL is lower than the first reference voltage VREF1, the first comparator CMP1 may output a first logic level, for example, a logic high signal, and when the voltage of the bit line BL is equal to or higher than the first reference voltage VREF1, the first comparator CMP1 may output a second logic level, for example, a logic low signal.

The second comparator CMP2 may, in response to the activated enable signal PSEN, compare the second reference voltage VREF2 and a voltage of the bit line BL, and output a comparison result. When the voltage of the bit line BL is lower than the second reference voltage VREF2, the second comparator CMP2 may output a logic low signal, and when the voltage of the bit line BL is equal to or higher than the second reference voltage VREF2, the second comparator CMP2 may output a logic high signal.

The first reference voltage VREF1 and the second reference voltage VREF2 may be set by considering a precharge voltage VBL and the first threshold voltage and the second threshold voltage of the bit line sense amplifier 121a. According to an exemplary embodiment of the inventive concept, the first reference voltage VREF1 may be a voltage between a first threshold voltage and a first power voltage, and the second reference voltage VREF2 may be voltage between a second threshold voltage and a second power voltage. According to an exemplary embodiment of the inventive concept, the first reference voltage VREF1 may be a voltage between the first threshold voltage and the precharge voltage VBL, and the second reference voltage VREF2 may be voltage between the second threshold voltage and the precharge voltage VBL.

The first logic gate LG1 may generate a charge signal BLCS based on outputs of the first comparator CMP1 and the second comparator CMP2. For example, the first logic gate LG1 may be an AND gate. The first logic gate LG1 may activate a charge signal BLCS when an output of the first comparator CMP1 is logic high, and an output of the second comparator CMP2 is logic high. Accordingly, the charge signal BLCS may be activated when a voltage of the bit line BL is lower than the first reference voltage VREF1 and higher than the second reference voltage VREF2.

The charging circuit 123a may apply a precharge voltage VBL to the bit line BL and the complementary bit line BLB in response to an equalization signal BLEQ or a charge signal BLCS. The charging circuit 123a may precharge the bit line BL and the complementary bit line BLB by applying a precharge voltage VBL to the bit line BL and the complementary bit line BLB based on the equalization signal BLEQ activated before a reading operation on a memory cell MC. In addition, the charging circuit 123a may apply a precharge voltage VBL to the bit line BL and the complementary bit line BLB when a charge signal BLCS output from the post-sensing circuit 122a is activated. Accordingly, voltage levels of the bit line BL and the complementary bit line BLB may be each ½VCC.

The charging circuit 123a may include a plurality of transistors MN3, MN4, and MN5 and a second logic gate LG2. For example, the transistors are NMOS transistors. The second logic gate LG2 may output a logic high signal when an equalization signal BLEQ or a charge signal BLCS is logic high. For example, the second logic LG2 may be an OR gate.

The NMOS transistors MN3 and MN4 may be serially connected between the bit line BL and the complementary bit line BLB, and the NMOS transistor MN5 may be connected between the bit line BL and the complementary bit line BLB. The NMOS transistors MN3, MN4, and MN5 may be turned on or off according to an output of the second logic gate LG2. When an output of the second logic gate LG2 is logic high, the NMOS transistors MN3 and MN4 may be turned on to apply a precharge voltage VBL to the bit line BL and the complementary bit line BLB, and the NMOS transistor MN5 may be turned on to equalize the bit line BL and the complementary bit line BLB.

Figure 6:
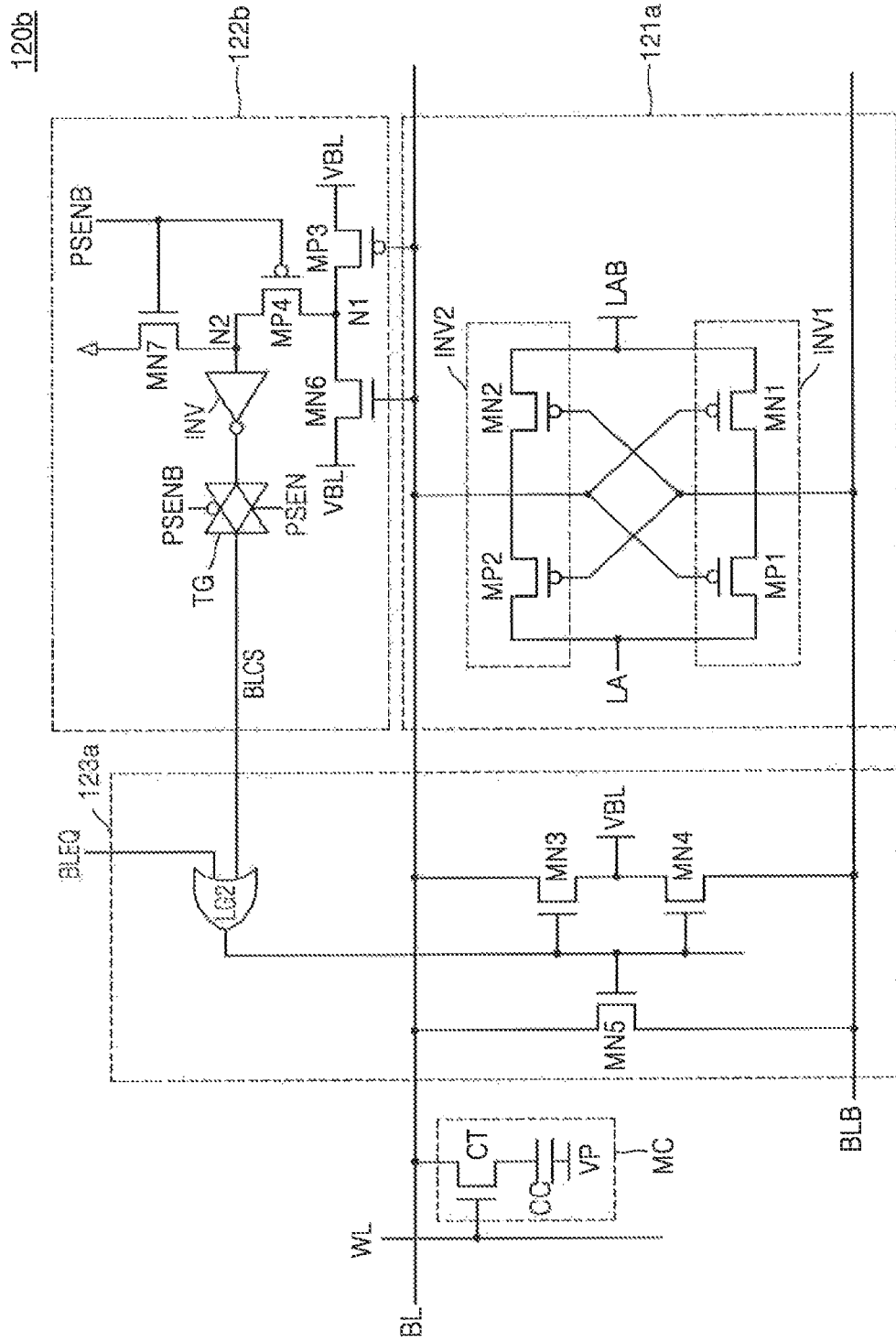
FIG. 6 is a circuit diagram of a sensing circuit according to an exemplary embodiment of the inventive concept.

FIG. 6 is a circuit diagram of a sensing circuit 120b according to an exemplary embodiment of the inventive concept. A memory cell MC is also illustrated for convenience of description.

Referring to FIG. 6, the sensing circuit 120b may include a bit line sense amplifier 121a, a post-sensing circuit 122b, and a charging circuit 123a. The bit line sense amplifier 121a and the charging circuit 123a of FIG. 6 are the same as the bit line sense amplifier 121a and the charging circuit 123a of FIG. 5. Thus, descriptions of the bit line sense amplifier 121a and the charging circuit 123a will be omitted.

Referring to FIG. 6, the post-sensing circuit 122b may sense a voltage level of the bit line BL by using physical characteristics of elements included inside the post-sensing circuit 122a, and generate a charge signal BLCS. The post-sensing circuit 122b may include a plurality of switching transistors MP3, MP4, MN6, and MN7, an inverter INV, and a transfer element TG.

A PMOS transistor MP3 and an NMOS transistor MN6 may be turned on or off according to a voltage level of the bit line BL. When the voltage level of the bit line BL is equal to or higher than a first reference voltage, the NMOS transistor MN6 may be turned on, and when the voltage level of the bit line BL is equal to or lower than a second reference voltage, the PMOS transistor MP3 may be turned on. The first reference voltage and the second reference voltage are threshold voltages at which the transistors MP3 and MN6 are turned on, and may be determined based on a precharge voltage VBL and threshold voltages of the PMOS transistor MP3 and the NMOS transistor MN6. The first reference voltage may be higher than ½VCC, which is a voltage level of the precharge level VBL, due to the threshold voltage of the NMOS transistor MN6, and the second reference voltage may be lower than ½VCC due to the threshold voltage of the PMOS transistor MP3.

When the NMOS transistor MN6 or the PMOS transistor MP3 is turned on, the precharge voltage VBL may be applied to a node N1 so that a voltage level of the node N1 may be ½VCC. When a voltage level of the bit line BL is lower than the first reference voltage and higher than the second reference voltage, the PMOS transistor MP3 and the NMOS transistor MN6 may be turned off, and the node N1 may be floated.

When an enable signal PSEN is inactivated, a complementary enable signal PSENB is activated. The NMOS transistor MN7 may be turned on in response to the complementary enable signal PSENB to apply a ground voltage to a node N2. A voltage level of the node N2 may be 0 V.

When an enable signal PSEN is activated, in response to the complementary enable signal PSENB, the NMOS transistor MN7 may be turned off, and the PMOS transistor MP4 may be turned on. When a voltage level of the node N1 is ½VCC, a voltage level of the node N2 may be changed from 0 V to ½VCC. When the node N1 is floated, the voltage level of the node N2 may be maintained at 0 V.

The inverter INV may output a logic high signal when an input voltage is 0 V, and output a logic low signal when an input voltage is ½VCC. The transfer element TG may output an output of the inverter INV as a charge signal BLCS when an enable signal PSEN is activated.

As described above, the post-sensing circuit 122b may output an inactivated charge signal BLCS when an enable signal PSEN is inactivated, and may inactivate or activate a charge signal BLCS based on a voltage level of the bit line BL when the enable signal PSEN is activated. When a voltage level of the bit line BL is lower than the first reference voltage and higher than the second reference voltage, the post-sensing circuit 122b may output a logic-high charge signal BLCS that is activated.

The sensing circuits 120a and 120b are described in detail above with reference to FIGS. 5 and 6. However, exemplary embodiments of the inventive concept are not limited thereto. For example, sensing circuits that operate in the same or similar manner as the sensing circuits 120a and 120b of FIGS. 5 and 6 may be employed in an exemplary embodiment of the inventive concept. Further, the sensing circuits 120a and 12b of FIGS. 5 and 6 may be modified in various ways.

Figure 7A:
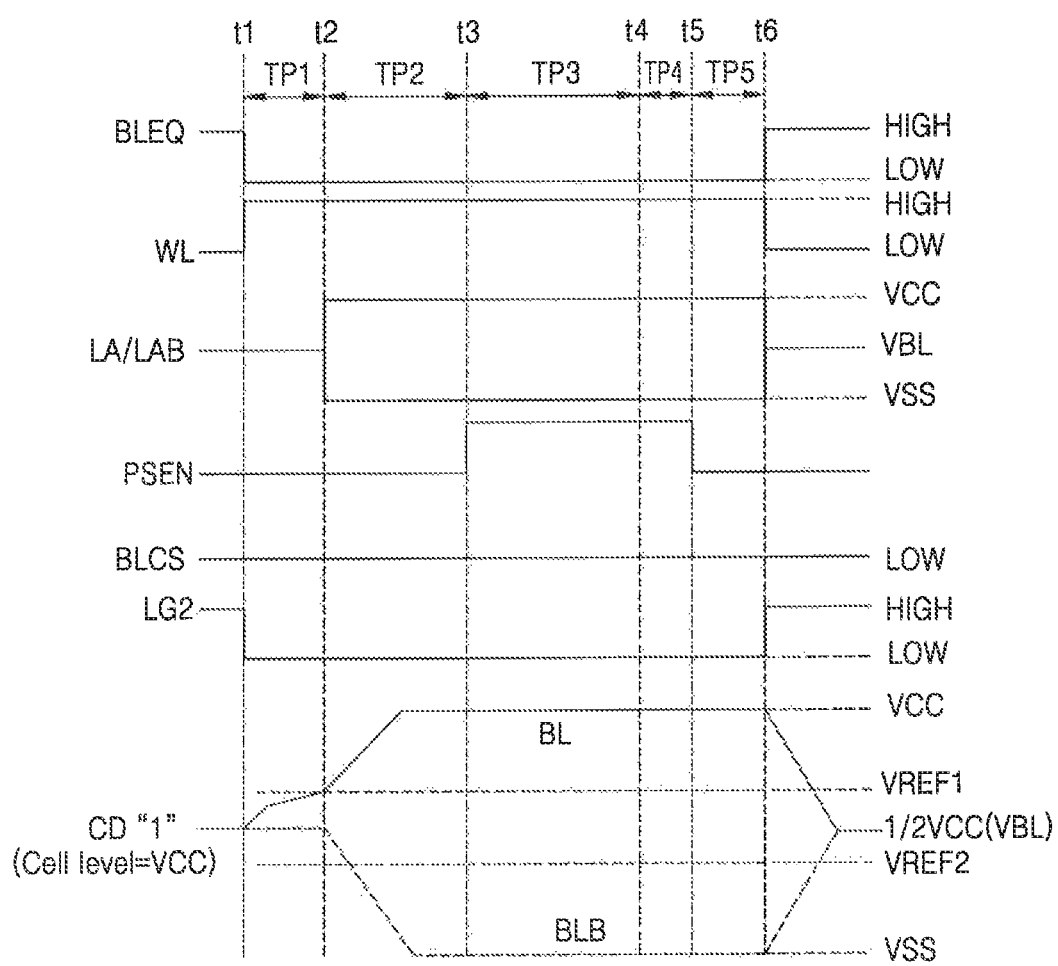
FIGS. 7A and 7B are timing diagrams for describing an operation of the sensing circuits of FIGS. 5 and 6 according to exemplary embodiments of the inventive concept.
Figure 7B:
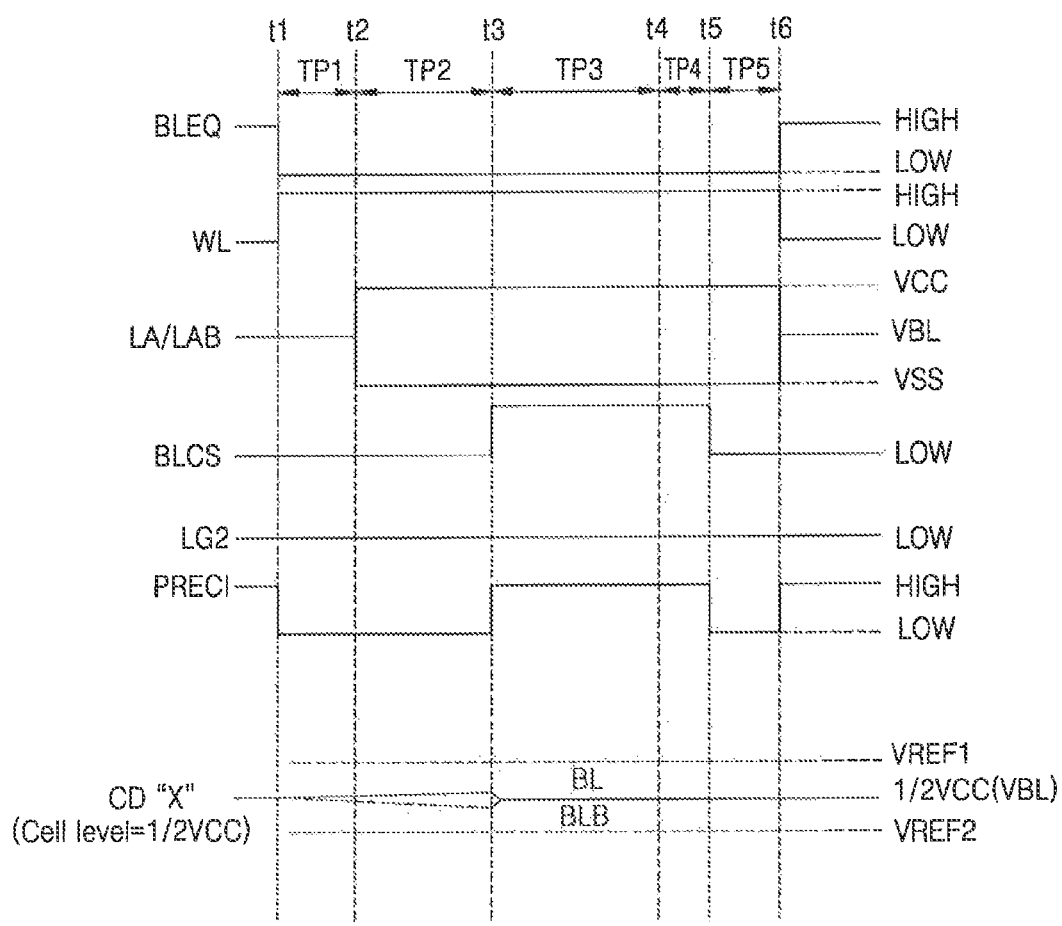

FIGS. 7A and 7B are timing diagrams for describing an operation of the sensing circuits 120a and 120b of FIGS. 5 and 6 according to exemplary embodiments of the inventive concept. FIG. 7A is a timing diagram of an operation of the second circuit 120b when cell data CD stored in a memory cell MC is in the first state HS, and FIG. 7B is a timing diagram of an operation of the sensing circuit 120b when cell data CD is in the third state MS.

Referring to FIG. 7A, an equalization signal BLEQ may be activated before a point t1, and a bit line BL and a complementary bit line BLB may be precharged by a precharging operation of the charging circuit 123b. Voltage levels of the bit line BL and the complementary bit line BLB may be each ½VCC.

When a word line enable voltage is applied to a word line WL at the point t1, charging sharing is performed between the memory cell MC and the bit line BL to increase a voltage level of the bit line BL.

When a first power voltage VCC and a second power voltage VSS are applied to the bit line sense amplifier 121a via the first power line LA and the second power line LAB at a point t2, the bit line sense amplifier 121a may sense and amplify a voltage difference dVBL between the bit line BL and the complementary bit line BLB. When cell data CD is in the first state HS, the voltage difference dVBL between the bit line BL and the complementary bit line BLB may be equal to or higher than a threshold value of the bit line sense amplifier 121a, and since the bit line sense amplifier 121a performs an amplifying operation, the bit line BL may be amplified to VCC, and the complementary bit line BLB may be amplified to VSS.

At a point t3, when an enable signal PSEN is activated, the post-sensing circuit 122a or 122b may sense the voltage level of the bit line BL based on the first reference voltage VREF1 and the second reference voltage VREF2 to generate a charge signal BLCS. According to an exemplary embodiment of the inventive concept, the first reference voltage VREF1 and the second reference voltage VREF2 may be voltages applied from the outside of the post-sensing circuit 122a. According to an exemplary embodiment of the inventive concept, the first reference voltage VREF1 and the second reference voltage VREF2 may be generated inside the post-sensing circuit 122b.

As the voltage level of the bit line BL is higher than the first and second reference voltages VREF1 and VREF2, the post-sensing circuits 122a or 122b may output a charge signal BLCS which is logic low. The equalization signal BLEQ and the charge signal BLCS are both logic low, and thus the charging circuit 123a does not perform a precharging operation, and a voltage of the bit line BL may be maintained as VCC.

At a point t4, voltages of the bit line BL and the complementary bit line BLB may be output. As the voltage of the bit line BL is VCC, cell data may be determined to be in the first state HS. Next, as a reading operation is completed, the equalization signal BLEQ may be activated again so that the bit line BL and the complementary bit line BLB are precharged again.

When referring to FIG. 7B, when cell data CD is in the third state MS, a cell level and a voltage level of the bit line BL are identical to a voltage level of the precharge voltage VBL, and accordingly, in a period TP1, in other words, during a charge sharing period, a voltage level of the bit line BL may barely change. When a first power voltage VCC and a second power voltage VSS are applied to the bit line sense amplifier 121a at the point t2, a potential difference between the bit line BL and the complementary bit line BLB is small and may be less than a threshold voltage difference. In this case, the bit line sense amplifier 121a may not perform a normal amplifying operation, and voltage levels of the bit line BL and the complementary bit line BLB may be barely amplified. A voltage difference between the bit line BL and the complementary bit line BLB may only be gradually increased due to a mismatch between internal elements of the bit line sense amplifier 121a.

At the point t3 of FIG. 7B, when the enable signal PSEN is activated, the post-sensing circuits 122a and 122b may compare the voltage level of the bit line BL with each of the first reference voltage VREF1 and the second reference voltage VREF2. Since the voltage level of the bit line BL is lower than the first reference voltage VREF1 and higher than the second reference voltage VREF2, the post-sensing circuits 122a and 122b may output a logic-high charge signal BLCS. As the charge signal BLCS is logic high, the charging circuit 123a may apply a precharge voltage VBL to the bit line BL and the complementary bit line BLB. After the point t3, voltage levels of the bit line BL and the complementary bit line BLB may be ½VCC.

At the point t4 of FIG. 7B, the voltage levels of the bit line BL and the complementary bit line BLB may be output. ½VCC may be output as the voltage levels of the bit line BL and the complementary bit line BLB. Accordingly, cell data may be determined to be in the third state MS.

When cell data CD is in the second state LS, an operation of the sensing circuit 120a is similar to that when cell data CD is in the first state HS. Thus, a description of the case where cell data CD is in the second state LS will be omitted.

FIGS. 7A and 7B further show the output of the second logic gate LG2. For example, in FIG. 7A, the output of the second logic gate LG2 is high before t1 and after t6 and low after t1 and up to t6. In FIG. 7B, the output of the second logic gate LG2 is low.

Figure 8:
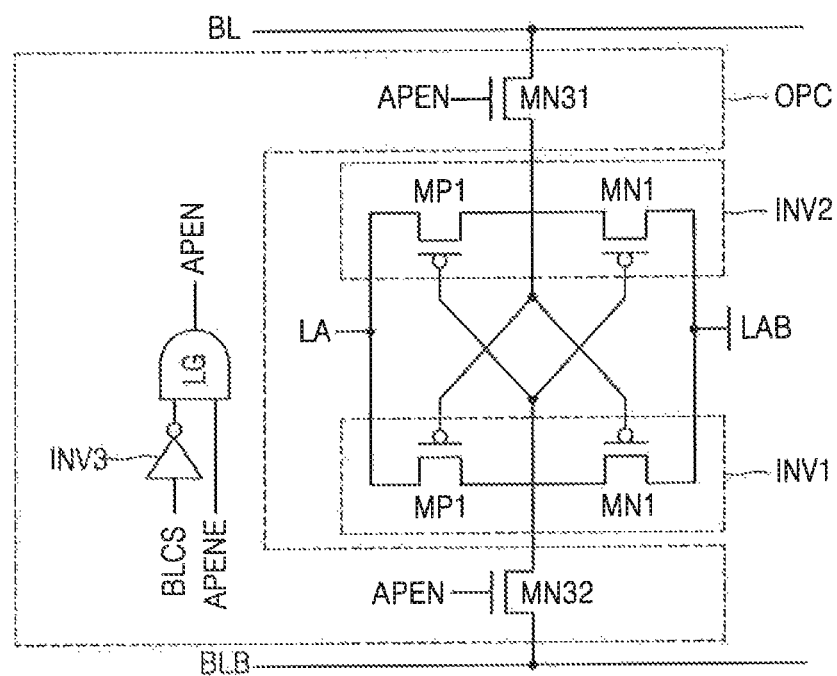
FIG. 8 is a circuit diagram illustrating a bit line sense amplifier according to an exemplary embodiment of the inventive concept.

FIG. 8 is a circuit diagram illustrating a bit line sense amplifier 121b according to an exemplary embodiment of the inventive concept.

The bit line sense amplifier 121b of FIG. 8 may stop an inverting amplifying operation when a charge signal BLCS output from the post-sensing circuit 122, 122a, or 122b of FIGS. 3, 5, and 6 is activated.

Referring to FIG. 8, the bit line sense amplifier 121b may include first and second inverters INV1 and INV2 and an operation controller OPC.

The operation controller OPC may control an inverting amplifying operation of the bit line sense amplifier 121b. The operation controller OPC may include a logic gate LG, a third inverter INV3, and switching transistors MN31 and MN32.

The third inverter INV3 may invert a charge signal BLCS, and output the inverted charge signal BLCS as a complementary charge signal BLCSB. The logic gate LG may generate an amp enable signal APEN based on the complementary charge signal BLCSB and an external amp enable signal APENE. The logic gate LG may output a logic-high amp enable signal APEN when the complementary charge signal BLCSB and the external amp enable signal APENE are logic high.

The operation controller OPC may include the switching transistors MN31 and MN32 respectively connected to the bit line BL and the complementary bit line BLB. The switching transistors MN31 and MN32 may be NMOS transistors. The NMOS transistors MN31 and MN32 may be turned on or off in response to an amp enable signal APEN. When an amp enable signal APEN is logic high, the NMOS transistor MN31 may connect an output node of the first inverter INV1 and an input node of the second inverter IINV2, and the NMOS transistor MN32 may connect an output node of the second inverter INV2 and an input node of the first inverter INV1.

When the switching transistors MN31 and MN32 of the operation controller OPC are turned on, the first inverter INV1 and the second inverter INV2 may respectively receive voltages of the bit line BL and the complementary bit line BLB and amplify a voltage difference between the bit line BL and the complementary bit line BLB via a mutual inverting operation. The bit line sense amplifier 121b of FIG. 8 is a modified example of the bit line sense amplifier 121a of FIG. 5, and operations of the first inverter INV1 and the second inverter INV2 of FIG. 8 are the same as those of the first inverter INV1 and the second inverter INV2 of the bit line sense amplifier 121a of FIG. 5, and thus a repeated description will be omitted.

An external amp enable signal APENE may be transitioned from logic low to logic high after charge sharing is performed between a memory cell and the bit line BL. After a voltage of the bit line BL is output, the external amp enable signal APENE may be transitioned from logic high to logic low. For example, the external amp enable signal APENE may be logic high during the periods TP2, TP3, and TP4 of FIGS. 7A and 7B. The complementary charge signal BLCSB may be logic low during the periods TP3 and TP4 FIGS. 7A and 7B according to cell data. For example, as illustrated in FIG. 7A, when cell data CD is in the first state HS or the second state LS, the charge signal BLCS may have a low level, and the complementary charge signal BLCSB may be a high level. Thus, during a reading operation on a memory cell, after charge sharing is performed, an inverting amplifying operation of the bit line sense amplifier 121b may be performed. However, as illustrated in FIG. 7B, when cell data CD is in the third state MS, an inverting amplifying operation of the bit line sense amplifier 121b may be stopped in response to the charge signal BLCS which is the high level.

Figure 9:
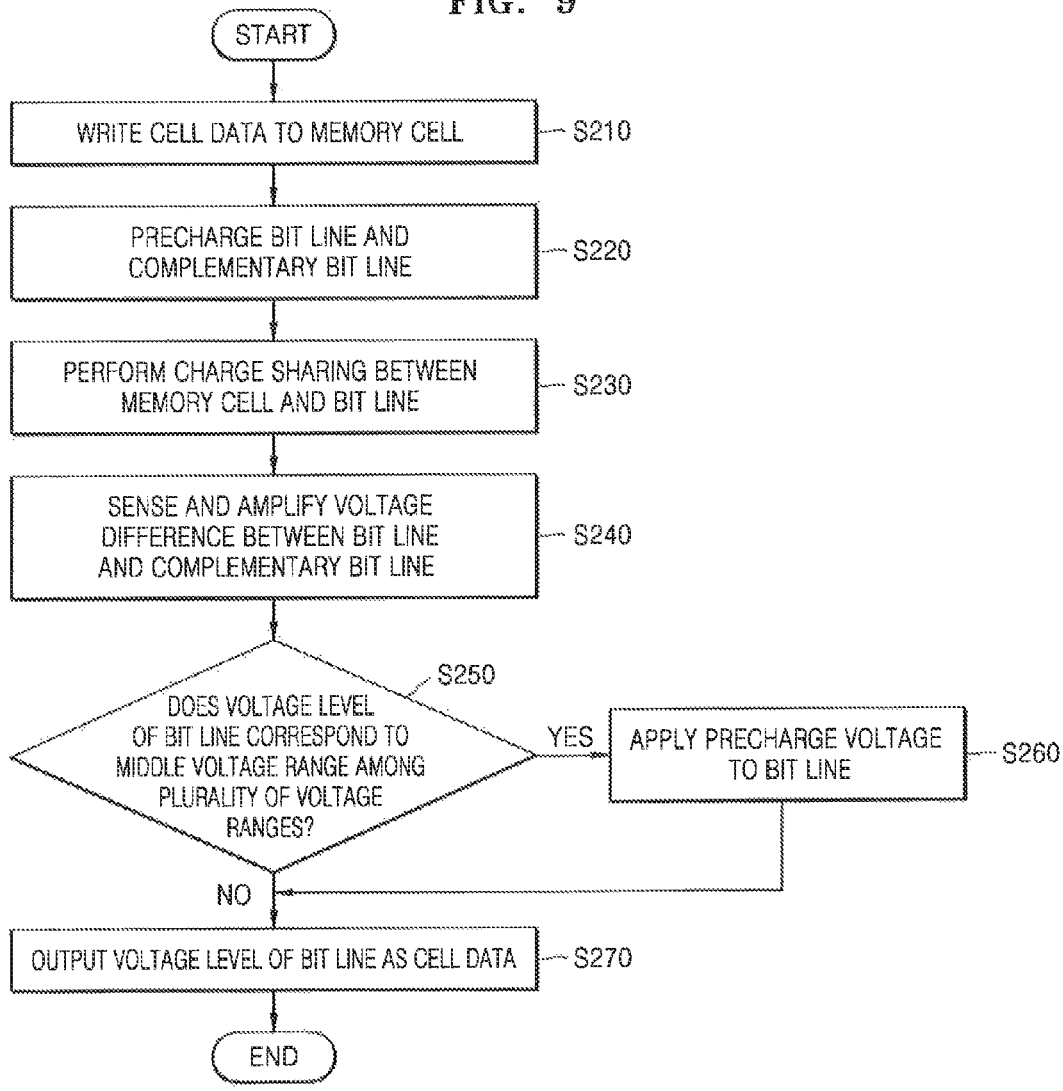
FIG. 9 is a flowchart of a method of operating a memory device according to an exemplary embodiment of the inventive concept.

FIG. 9 is a flowchart of a method of operating a memory device according to an exemplary embodiment of the inventive concept.

The method of operating a memory device of FIG. 9 corresponds to a method of writing and reading cell data to a memory cell MC of the memory device 100 of FIG. 2 or the memory device 100a of FIG. 3. Descriptions provided with reference to FIGS. 1 through 8 may be applied to the method of operating a memory device according to the present exemplary embodiment.

Referring to FIG. 9, cell data may be written to a memory cell in operation S210. Cell data may have one of at least three states. When a word line voltage is applied to a word line connected to a memory cell so that the memory cell and a bit line are connected to each other, one of at least three voltages respectively corresponding to one of the at least three states of the cell data may be applied to the bit line to thereby write the cell data. According to an exemplary embodiment of the inventive concept, cell data may have one of first through third states: a first power voltage may be applied to a bit line in response to the first state of the cell data; a second power voltage may be applied to a bit line in response to the second state of the cell data; and a third power voltage may be applied to a bit line in response to the third state of the cell data. The third power voltage may be an average of the first and second power voltages.

After the cell data is written, the bit line and a complementary bit line may be precharged in operation S220. By applying a precharge voltage to the bit line and the complementary bit line, the bit line may be precharged. The complementary bit line may also be precharged. According to an exemplary embodiment of the inventive concept, the third power voltage which is a middle level between the first power voltage and the second power voltage may be used as a precharge voltage.

Next, the following operations may be performed to read the cell data stored in the memory cell from the memory cell.

Charge sharing may be performed between the memory cell and the bit line in operation S230. When a word line enable voltage is applied to a word line, the memory cell and the bit line are connected and charge sharing may be performed between the memory cell and the bit line. A voltage level of the memory cell may be equal to a voltage level of a voltage applied to the bit line according to a state of the cell data (e.g., one of the first to third states). A voltage level of the memory cell may be higher or lower than a voltage level of a precharged bit line, according to cell data stored in the memory cell, or may be equal to the voltage level of the precharged bit line. If a voltage level of the memory cell is higher or lower than the voltage level of the bit line, the voltage level of the bit line may be increased or reduced by charge sharing. Accordingly, a voltage difference may be generated between the bit line and the complementary bit line.

In operation S240, the voltage difference between the bit line and the complementary bit line may be sensed and amplified. When the voltage level of the bit line is equal to or higher than a first threshold voltage or equal to or lower than a second threshold voltage, the voltage difference between the bit line and the complementary bit line is equal to or higher than a threshold value. Thus, the voltage level of the bit line may be amplified to the first power voltage or the second power voltage, and the voltage level of the complementary bit line may be amplified to the second power voltage or the first power voltage.

In operation S250, the voltage level of the bit line may be sensed, and whether the voltage level of the bit line is included in a middle voltage range among a plurality of voltage ranges may be determined. The voltage level of the bit line may be sensed based on a first reference voltage and a second reference voltage. According to an exemplary embodiment of the inventive concept, the plurality of voltage ranges may include a first voltage range, a second voltage range, and a third voltage range. The first through third voltage ranges may be distinguished based on the first reference voltage and the second reference voltage. The first voltage range is a voltage range between the first reference voltage and the second reference voltage. The second voltage range may be a voltage range between the first power voltage and the first reference voltage. The third voltage range may be a voltage range between the second reference voltage and the second power voltage. The first voltage range may be a middle voltage range. Whether a voltage level of a bit line is included in the first voltage range, in other words, whether a voltage level of a bit line is lower than the first reference voltage and higher than the second reference voltage may be determined. When a voltage level of a bit line is included in the middle voltage range among the plurality of voltage ranges, cell data may be determined to be in the third state. Otherwise, cell data may be determined to be in the first state or the second state.

When a voltage level of a bit line is included in the middle voltage range, a precharge voltage may be applied to the bit line in operation S260. The precharge voltage may be a middle level between the first power voltage and the second power voltage. If a voltage level of a bit line is not included in the middle voltage range, in other words, if a voltage level of a bit line is equal to or higher than the first reference voltage or equal to or lower than the second reference voltage, operation S260 of applying a precharge voltage may be omitted and operation S270 may be performed immediately after operation S250.

Next, cell data may be output by outputting the voltage of the bit line in operation S270. If a voltage level of a bit line is included in the second voltage range or the third voltage range, the voltage level of the bit line may be amplified to the first power voltage or the second power voltage. The output voltage level of the bit line may be VCC or VSS, and cell data may be determined to be in the first state or the second state. When a voltage level of a bit line is included in the first voltage range, since a precharge voltage is applied, the output voltage level of the bit line may be ½VCC, and cell data may be determined to be in the third state.

Figure 10:
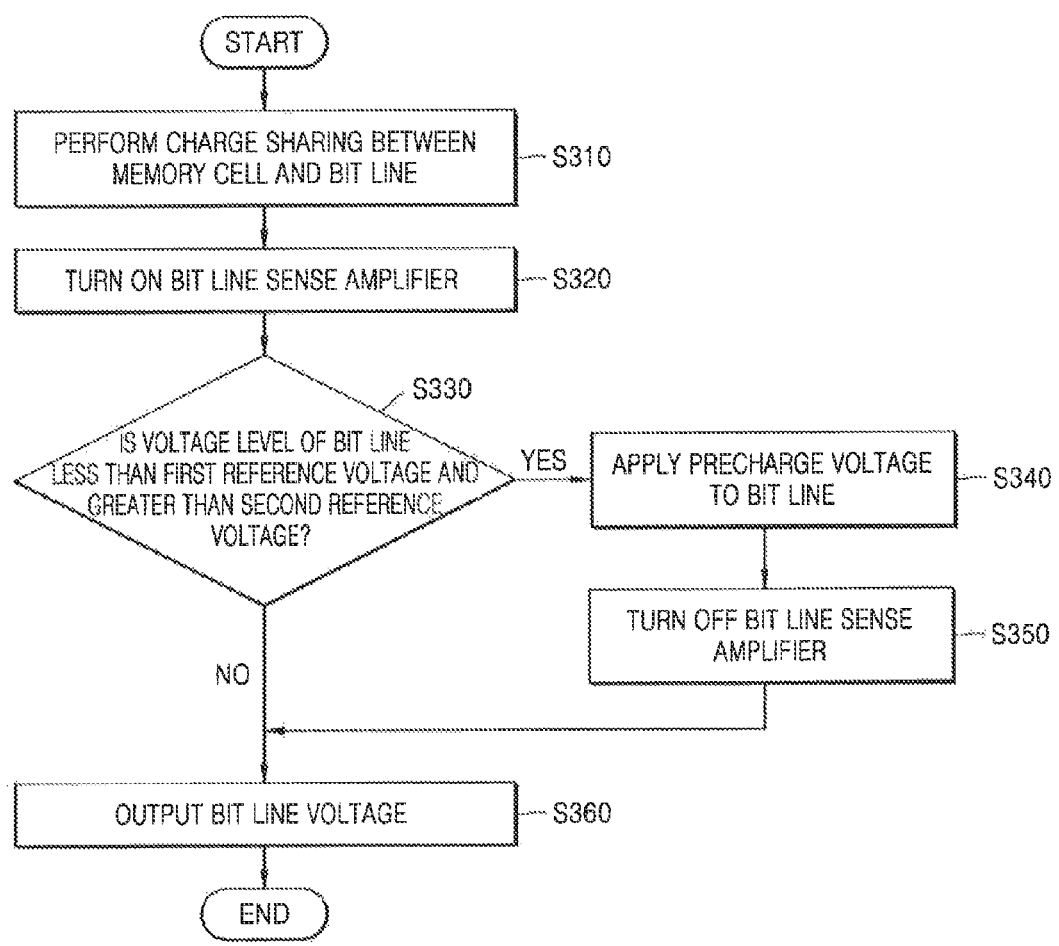
FIG. 10 is a flowchart of a method of operating a memory device according to an exemplary embodiment of the inventive concept.

FIG. 10 is a flowchart of a method of operating a memory device according to an exemplary embodiment of the inventive concept. The method of operating a memory device of FIG. 10 corresponds to a method of writing and reading cell data to and from a memory cell MC of the memory device 100 of FIG. 2 or the memory device 100a of FIG. 3. Thus, descriptions provided with reference to FIGS. 1 through 9 may be applied to the method of operating a memory device according to the present exemplary embodiment.

Referring to FIG. 10, when reading on a memory cell is requested, charge sharing may be performed between the memory cell and a bit line in operation S310. Before charge sharing is performed, voltage levels of the bit line and a complementary bit line may be the same. The voltage level of the bit line may be changed due to charge sharing, and accordingly, a voltage difference may be generated between the bit line and the complementary bit line.

After charge sharing, a bit line sense amplifier (for example, the bit line sense amplifier 121 of FIG. 3) may be turned on in operation S320. For example, a first power voltage and a second power voltage may be applied as driving voltages to the bit line sense amplifier, the bit line sense amplifier is electrically connected to the bit line and the complementary bit line, and thus the bit line sense amplifier may be turned on. The bit line sense amplifier may sense and amplify the voltage difference between the bit line and the complementary bit line.

In operation S330, whether the voltage level of the bit line is lower than the first reference voltage and higher than the second reference voltage may be determined. In other words, whether cell data is in the third state may be determined. A post-sensing circuit (for example, the post-sensing circuit 122 of FIG. 3) may compare the voltage level of the bit line that is amplified by using the bit line sense amplifier, with each of the first reference voltage and the second reference voltage, to determine whether the voltage level of the bit line is a voltage level between the first reference voltage and the second reference voltage. When the voltage level of the bit line is lower than the first reference voltage and higher than the second reference voltage, the post sensing circuit may generate an activated bit line charge signal.

When the voltage level of the bit line is lower than the first reference voltage and higher than the second reference voltage, a precharge voltage may be applied to the bit line in operation S340. In response to the activated bit line charge signal, a charging circuit (for example, the charging circuit 123 of FIG. 3) may apply a precharge voltage to the bit line and the complementary bit line.

In addition, the bit line sense amplifier may be turned off in operation S350. As the bit line sense amplifier is electrically disconnected from the bit line and the complementary bit line in response to the activated bit line charge signal, the bit line sense amplifier may be turned off. If a voltage level of the bit line is equal to or higher than the first reference voltage or equal to or lower than the second reference voltage, the bit line sense amplifier may continuously perform an amplifying operation.

Operation S350 of turning off the bit line sense amplifier may be performed before operation S340 of applying a precharge voltage. In addition, operation S350 of turning off the bit line sense amplifier and operation S340 of applying a precharge voltage may be performed simultaneously.

Next, the voltage level of the bit line may be output in operation S360. In previous operations, if the voltage level of the bit line is equal to or higher than the first reference voltage or equal to or lower than the second reference voltage, in other words, if cell data is in the first state or the second state, the voltage of the bit line may be amplified to a first power voltage or a second power voltage. If a voltage level of the bit line is lower than the first reference voltage and higher than the second reference voltage, in other words, if cell data is in the third state, the voltage of the bit line may be a precharge voltage, for example, the third power voltage. Accordingly, a voltage level of one of the first power voltage, the second power voltage, and the third power voltage may be output. For example, one of VCC, VSS, and ½VCC may be output. A state of cell data may be determined based on an output voltage.

Figure 11:
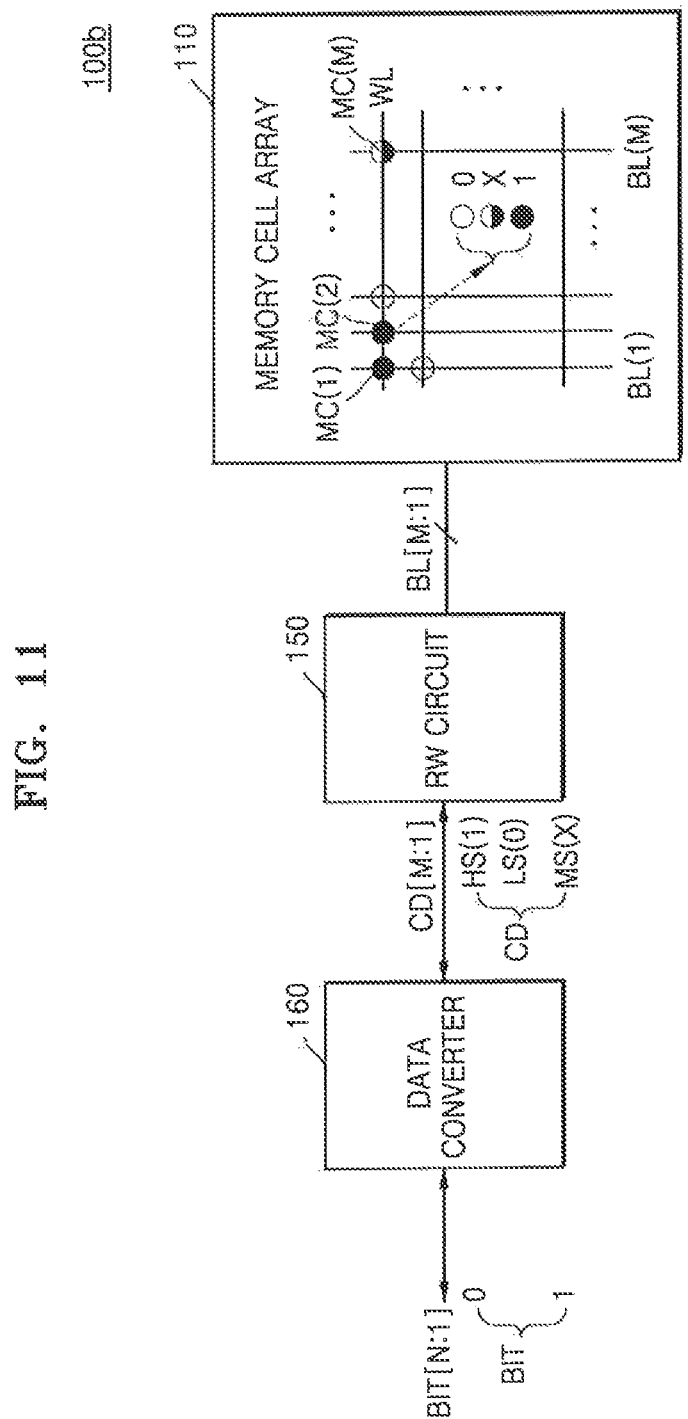
FIG. 11 is a block diagram illustrating a memory device according to an exemplary embodiment of the inventive concept.

FIG. 11 is a block diagram illustrating a memory device 100b according to an exemplary embodiment of the inventive concept.

Referring to FIG. 11, the memory device 100b may include a memory cell array 110, a read/write circuit 150, and a data converting circuit 160. The memory device 100b may receive N-bit data BIT[N:1] from the outside, and store the N-bit data BIT[N:1] in M memory cells MC1 through MCm. M is a natural number equal to or greater than 2, and N is a natural number greater than M.

The data converting circuit 160 may convert N-bit data BIT[N:1] into M pieces of cell data CD[M:1] or convert M pieces of cell data CD[M:1] into N-bit data BIT[N:1]. The N-bit data BIT[N:1] is digital data BIT, and the digital data BIT may have one of two states of '0' and '1'. Cell data CD may be multi-level data having one of at least three states. The number of states of cell data CD is more than the number of states of the digital data BIT, and thus, the number of pieces of cell data CD is less than the number of pieces of the digital data BIT. According to an exemplary embodiment of the inventive concept, the cell data CD may have a first state HS, a second state LS, or a third state MS, and the data converting circuit 160 may convert three-bit data BIT [3:1] to two pieces of cell data CD[2:1] and two pieces of cell data CD[2:1] to three-bit data BIT[3:1]. A converting operation of the data converting circuit 160 will be described in more detail below with reference to FIGS. 12 and 13.

The write/read circuit 150 may write cell data CD to a memory cell MC or read cell data CD from a memory cell MC. The memory cell MC may be a multi-level memory cell for storing multi-level data. Each memory cell MC may have one of at least three states corresponding to the cell data CD. As described above with reference to FIG. 2A, the write/read circuit 150 may write cell data CD to a memory cell MC by applying a voltage corresponding to a state of the cell data CD to a bit line BL. In addition, the write/read circuit 150 may read the cell data CD by using a speed of a variation in a voltage level of the bit line BL according to a state of the cell data CD stored in the memory cell MC and amplifying characteristics of the bit line sense amplifier as described above with reference to FIGS. 1 through 10. To this end, the write/read circuit 150 may include the sensing circuit 120, 120a, or 120b described above with reference to FIGS. 2A through 8. The sensing circuit 120, 120a, or 120b may be connected to each of bit lines BL(1) through BL(M).

As described above, as the data converting circuit 160 converts the received N-bit data BIT[N:1] into M pieces of cell data (M:1), and the write/read circuit 150 writes M pieces of cell data (M:1) to M memory cells MC(1) through MC(M), the N-bit data BIT[N:1] may be stored in the M memory cells MC(1) through MC(M). In addition, as the write/read circuit 150 reads the M pieces of cell data (M:1) from the M memory cells MC(1) through MC(M), and the data converting circuit 160 converts the M pieces of cell data (M:1) into N-bit data BIT[N:1], the N-bit data BIT[N:1] may be output from the M memory cells MC(1) through MC(M).

According to the memory device 100b of the present exemplary embodiment, by storing multi-level data in the memory cell MC, a storage capacity may be increased or a layout area of a memory cell array may be reduced.

Figure 12:
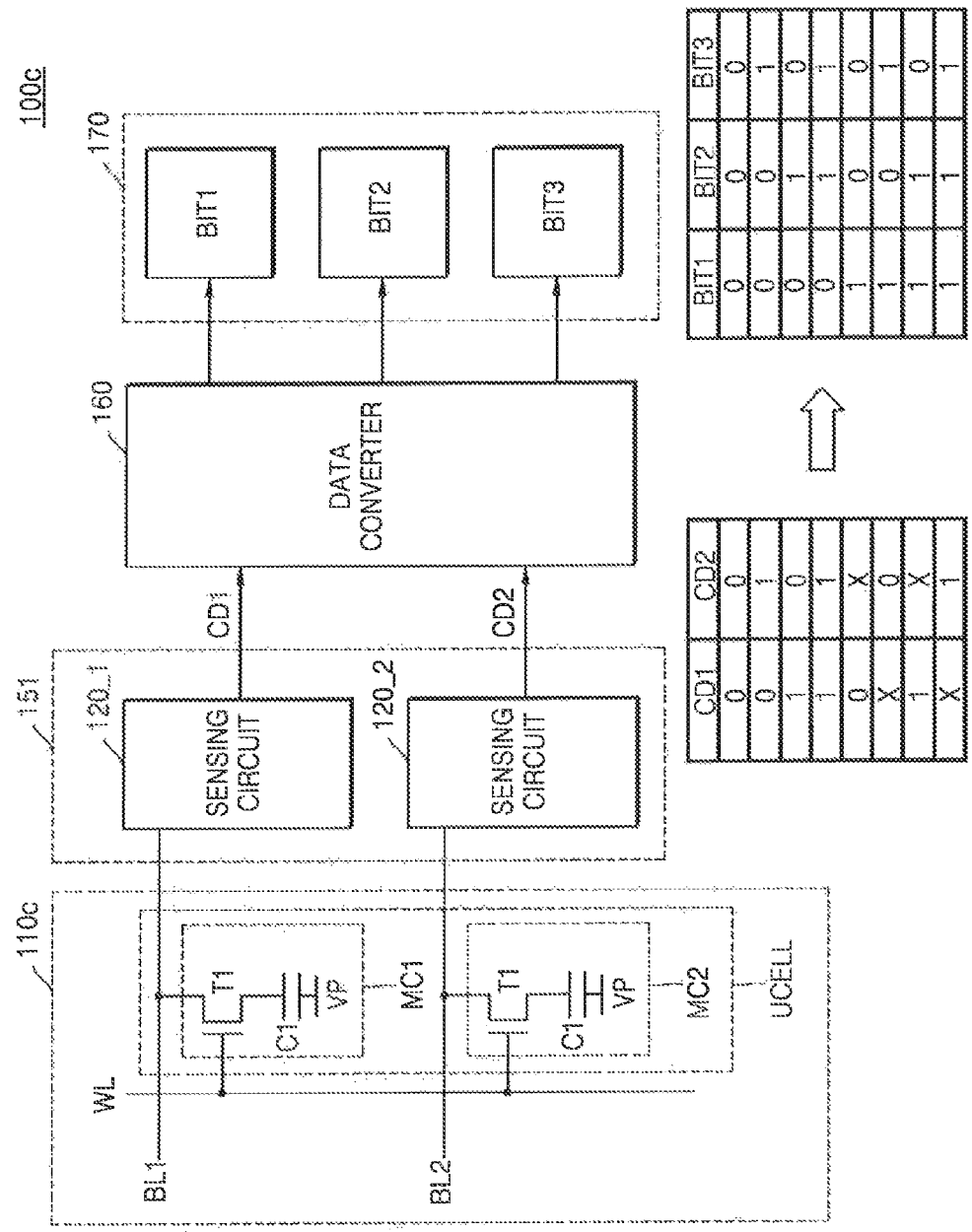
FIG. 12 is a block diagram illustrating a memory device according to an exemplary embodiment of the inventive concept.

FIG. 12 is a block diagram illustrating a memory device 100c according to an exemplary embodiment of the inventive concept.

Referring to FIG. 12, the memory device 100c may include a memory cell array 110c, a read circuit 151, a data converting circuit 160, and a buffer 170. The memory device 100c may generate first through third three-bit data BIT1, BIT2, and BIT3 based on cell data CD1 and CD2 output from two memory cells MC1 and MC2.

The memory cell array 110c may include a plurality of unit cells UCELL, and a writing operation or a reading operation may be individually performed on each of the unit cells UCELL. A unit cell UCELL may include a first memory cell MC1 and a second memory cell MC2. In exemplary embodiments of the inventive concept, the first memory cell MC1 and the second memory cell MC2 may be adjacent to each other or non-adjacent memory cells which are included in the same memory block. The first memory cell MC1 and the second memory cell MC2 may correspond to the memory cell MC shown in FIG. 2A. In FIG. 12, T1 corresponds to a transistor.

The read circuit 151 may include a first sensing circuit 120_1 and a second sensing circuit 120_2 respectively connected to a first bit line BL1 and a second bit line BL2, and may read first cell data CD1 and second cell data CD2 from the unit cell UCELL. The first sensing circuit 120_1 and the second sensing circuit 120_2 may be the sensing circuit 120, 120a, or 120b described with reference to FIGS. 2A through 8.

The data converting circuit 160 may combine the three states HS, LS, and MS of the first cell data CD1 and the second cell data CD2 to generate first through third bit data BIT1, BIT2, and BIT3, and may output the first through third bit data BIT1, BIT2, and BIT3. The first through third bit data BIT1, BIT2, and BIT3 may be stored in the buffer 170.

In FIG. 12, the three states of cell data CD are indicated as '1', '0', and 'X'. The first through third bit data BIT1, BIT2, and BIT3 may be generated according to a combination of the three states of the first cell data CD1 and the three states of the second cell data CD2. When both the first cell data CD1 and the second cell data CD2 are in the third state ('X'), there is no corresponding first through third bit data BIT1, BIT2, and BIT3. When both the first cell data CD1 and the second cell data CD2 are in the third state ('X'), the data converting circuit 160 may determine that a read error occurred. According to an exemplary embodiment of the inventive concept, the data converting circuit 160 may output a read error generating signal. According to an exemplary embodiment of the inventive concept, the data converting circuit 160 may output one of eight combinations of the first through third bit data BIT1, BIT2, and BIT3 illustrated in FIG. 12 despite occurrence of a read error.

Figure 13:
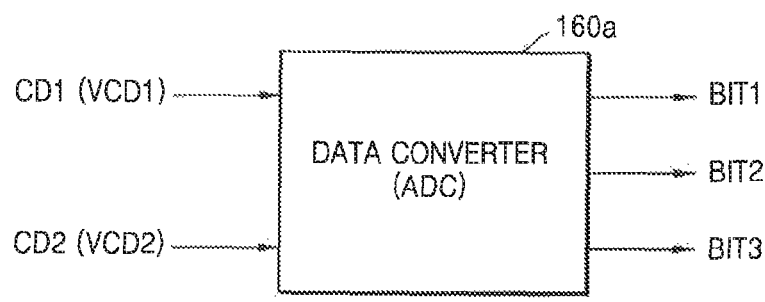
FIG. 13 is a block diagram illustrating a data converting circuit according to an exemplary embodiment of the inventive concept.

FIG. 13 is a block diagram illustrating a data converting circuit 160a according to an exemplary embodiment of the inventive concept. The data converting circuit 160a according to the present exemplary embodiment may be an analog-to-digital converter (ADC). As described above with reference to FIGS. 2A through 8, voltage levels of a bit line, such as VCC, VSS, and ½VCC, may be output as cell data CD. As illustrated in FIG. 13, the data converting circuit 160a may convert a combination of a first cell data voltage VCD1 and a second cell data voltage VCD2 respectively representing first and second cell data CD1 and CD2, into first through third bit data BIT1, BIT2, and BIT3. The tables in FIG. 13 show values of the first and second cell data CD1 and CD2 and values of the first through third bit data BIT1, BIT2, and BIT3 corresponding to the first and second cell data CD1 and CD2.

Figure 14:
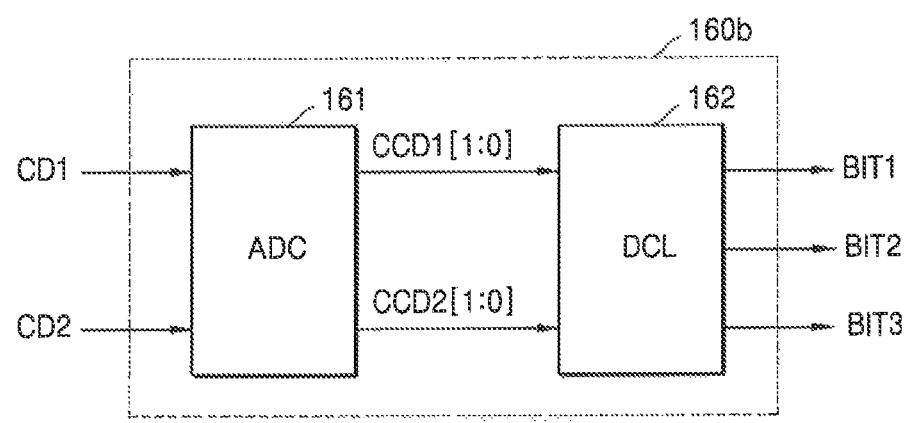
FIG. 14 is a block diagram illustrating a data converting circuit according to an exemplary embodiment of the inventive concept.

FIG. 14 is a block diagram illustrating a data converting circuit 160b according to an exemplary embodiment of the inventive concept.

Referring to FIG. 14, the data converting circuit 160b may include an ADC 161 and a data conversion logic 162. The data converting circuit 160b may convert each of first cell data CD1 and second cell data CD2 into two-bit digital data. The first cell data CD1 may be converted into first conversion data CCD1[1:0], and the second cell data CD2 may be converted into second conversion data CCD2[1:0]. The data conversion logic 162 may convert the first and second conversion data CCD1[1:0] and CCD2[1:0] into first through third bit data BIT1, BIT2, and BIT3.

Figure 15A:
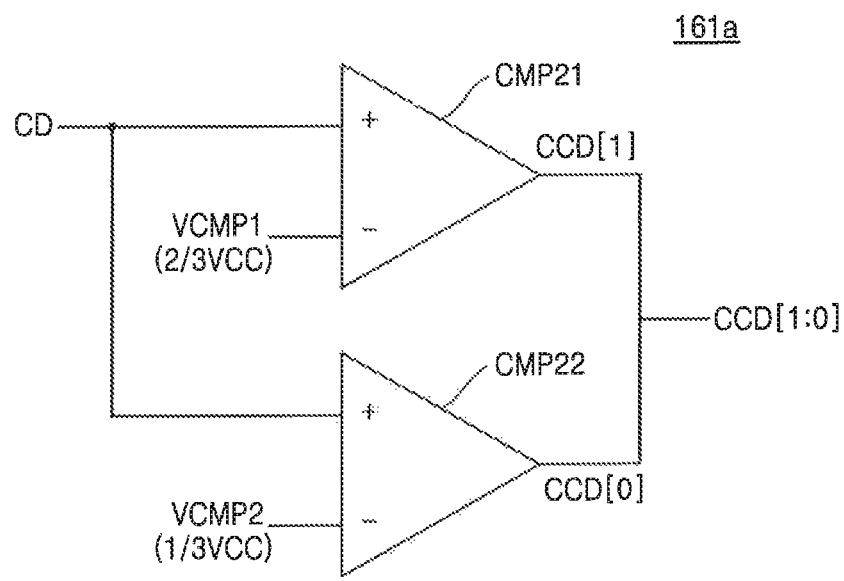
FIGS. 15A and 15B are circuit diagrams illustrating an analog-to-digital converter of FIG. 14 according to an exemplary embodiment of the inventive concept.
Figure 15B:
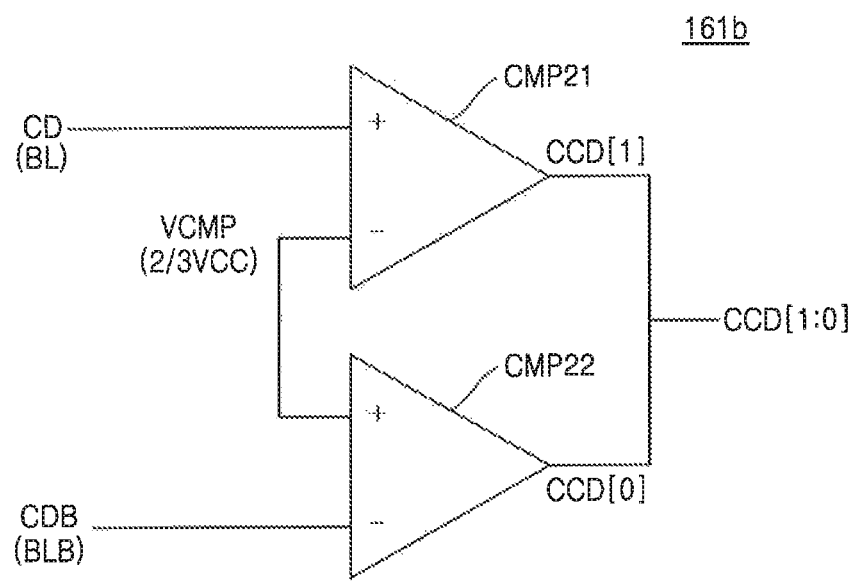

FIGS. 15A and 15B are circuit diagrams illustrating the analog-to-digital converter (ADC) 161 of FIG. 14, according to exemplary embodiments of the inventive concept.

Referring to FIG. 15A, an ADC 161a may include a first comparator CMP21 and a second comparator CMP22. The first comparator CMP21 may compare cell data CD with a first comparison voltage VCMP1 to output a comparison result CCD[1], and the second comparator CMP22 may compare cell data CD with a second comparison voltage VCMP2 to output a comparison result CCD[0].

A voltage level of the first comparison voltage VCMP1 may be ⅔VCC, and a voltage level of the second comparison voltage VCMP2 may be ⅓VCC. Accordingly, when cell data CD is in the first state "1," conversion data CCD[1:0] may be output as '11', and when cell data CD is in the second state "0," conversion data CCD[1:0] may be output as '00', and when cell data CD is in the third state "X," conversion data CCD[1:0] may be output as '01'. This is reflected in the table of FIG. 15A.

According to an exemplary embodiment of the inventive concept, the ADC 161a may sequentially receive the cell data CD1 and the cell data CD2, and then sequentially output first conversion data CCD[1:0] and the second cell data CD2.

Referring to FIG. 15B, an ADC 161b may include a first comparator CMP21 and a second comparator CMP22. Unlike FIG. 15A, the ADC 161b of FIG. 15B may convert cell data into two-bit digital data based on a single comparison voltage VCMP. The first comparator CMP21 and the second comparator CMP22 may each receive cell data CD and complementary cell data CDB as inputs. The cell data CD may be a voltage level of a bit line BL, and the complementary cell data CDB may be a voltage level of a complementary bit line BLB.

The first comparator CMP21 may compare the cell data CD with the comparison voltage VCMP to output a comparison result CCD[1], and the second comparator CMP22 may compare the complementary cell data CDB with the comparison voltage VCMP to output a comparison result CCD[0].

A voltage level of the comparison voltage VCMP may be ⅔VCC. Accordingly, when the cell data CD is in the first state "1," conversion data CCD[1:0] may be output as '10', and when the cell data CD is in the second state "0," conversion data CCD[1:0] may be output as '01', and when the cell data CD is in the third state "X," conversion data CCD[1:0] may be output as '00'. This is reflected in the table of FIG. 15B.

Referring to FIG. 14 again, the data conversion logic 162 may combine the first and second conversion data CCD1[1:0] and CCD2[1:0] each having one of three values to generate the first through third bit data BIT1, BIT2, and BIT3.

While examples of an ADC are described above with reference to FIGS. 15A and 15B, these are merely exemplary, and the inventive concept is not limited thereto. For example, an ADC circuit of FIGS. 15A and 15B may be modified in various ways.

Figure 16:
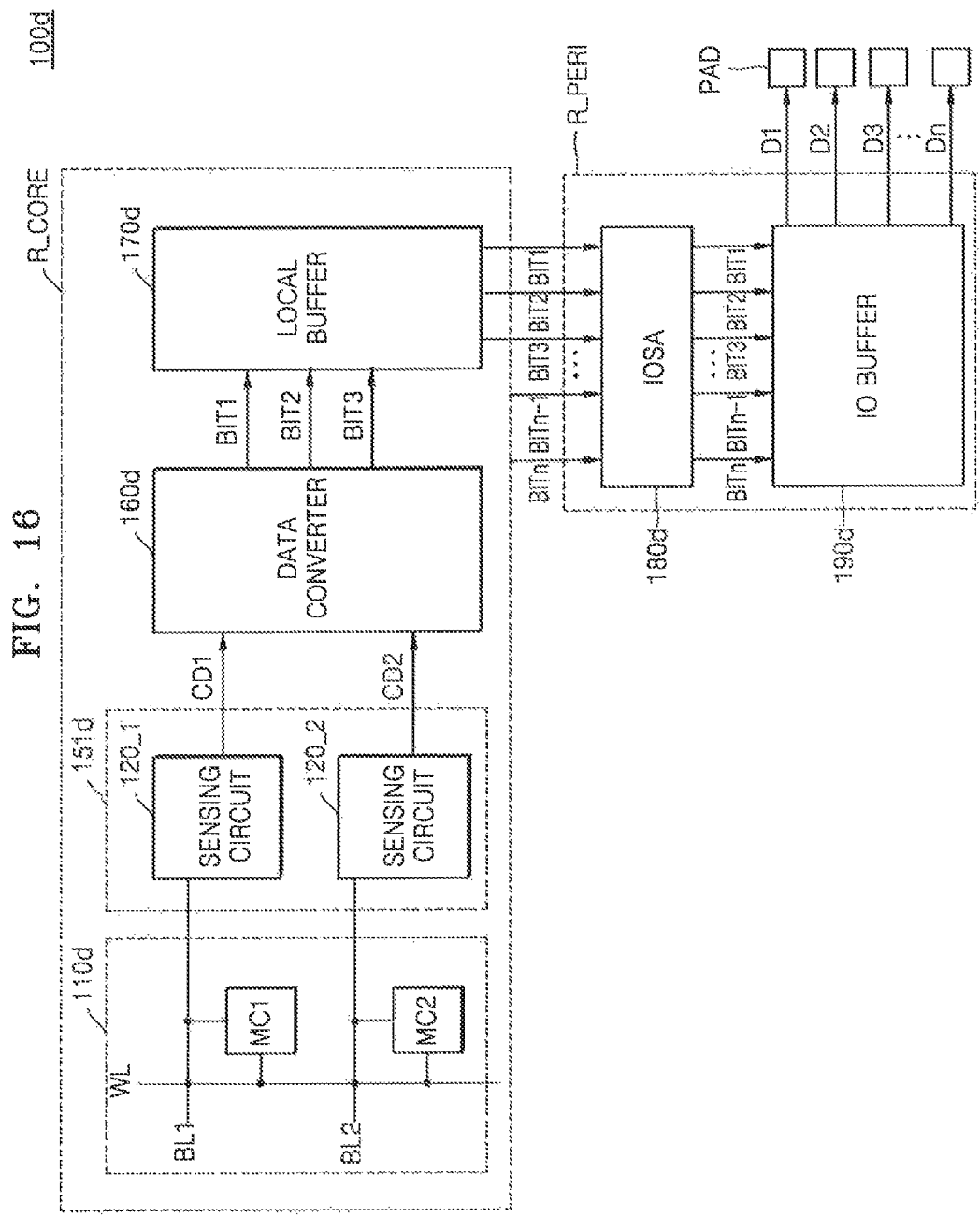
FIG. 16 is a block diagram illustrating a memory device according to an exemplary embodiment of the inventive concept.

FIG. 16 is a block diagram illustrating a memory device 100d according to an exemplary embodiment of the inventive concept.

Referring to FIG. 16, the memory device 100d may include a core region R_CORE and a peripheral region R_PERI. The core region R_CORE may include a memory cell array 110d including a plurality of memory cells MC1 and MC2, a read circuit 151d including a plurality of sensing circuits 120_1 and 120_2, a data converting circuit 160d, and a local buffer 170d. In FIG. 16, two memory cells MC1 and MC2, two sensing circuits 121_1 and 121_2, one data converting circuit 160d, and one local buffer 170d are illustrated for convenience of description. An input/output sense amplifier 180d and an input/output buffer 190d may be arranged in the peripheral region R_PERI.

The read circuit 151d may read first and second cell data CD1 and CD2 from the first and second memory cells MC1 and MC2, and the data converting circuit 160d may convert the read first and second cell data CD1 and CD2 into first through third bit data BIT1, BIT2, and BIT3. The local buffer 170d may buffer the first through third bit data BIT1, BIT2, and BIT3 and transmit the buffered bit data to the input/output sense amplifier 180d arranged in the peripheral region R_PERI.

The input/output sense amplifier 180d may receive a plurality of pieces of digital data BIT1 through BITn from the local buffer 170d. The input/output sense amplifier 180d may amplify voltage levels of the received plurality of pieces of digital data BIT1 through BITn and transmit the amplified voltage levels of the digital data BIT1 through BITn to the input/output buffer 190d. The input/output buffer 190d may temporarily store the plurality of pieces of digital data BIT1 through BITn, and may output the plurality of pieces of digital data BIT1 through BITn as a plurality of pieces of read data D1 through Dn via a pad PAD.

Figure 17:
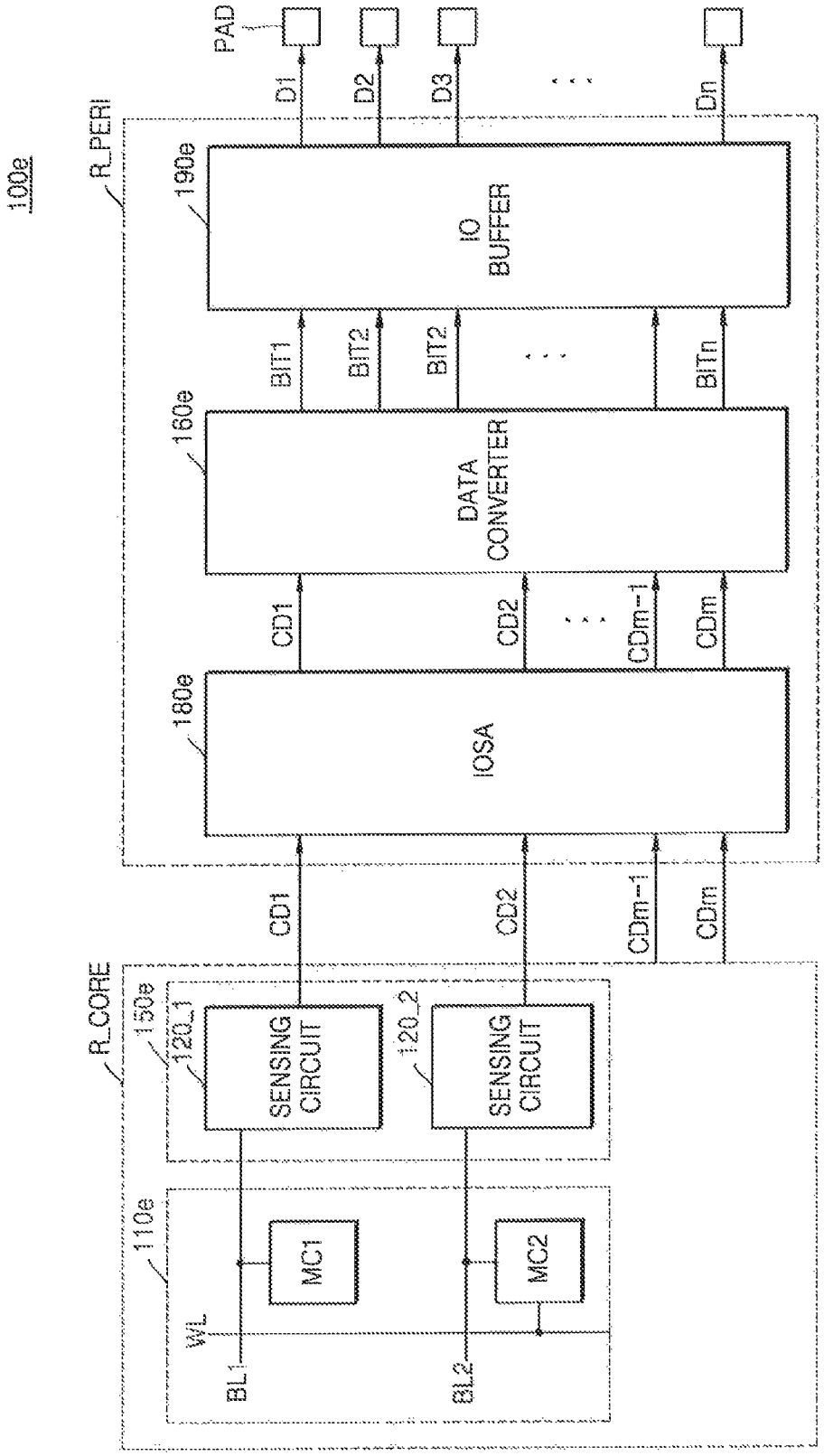
FIG. 17 is a block diagram illustrating a memory device according to an exemplary embodiment of the inventive concept.

FIG. 17 is a block diagram illustrating a memory device 100e according to an exemplary embodiment of the inventive concept.

Referring to FIG. 17, the memory device 100d may include a core region R_CORE and a peripheral region R_PERI. The core region R_CORE may include a memory cell array 110e including a plurality of memory cells MC1 and MC2, and a read circuit 151e including a plurality of sensing circuits 120_1 and 120_2. In FIG. 17, two memory cells MC1 and MC2 and two sensing circuits 120_1 and 120_2 are illustrated for convenience of description. However, more memory cells and sensing circuit may be included in the core region R_CORE as evidenced by the output of signals CDm−1 and CDm. An input/output sense amplifier 180e, a data converting circuit 160e, and an input/output buffer 190e may be arranged in the peripheral region R_PERI. Unlike the data converting circuit 160d of FIG. 16, the data converting circuit 160e of FIG. 17 may be arranged in the peripheral region R_PERI.

The read circuit 151e may read first and second cell data CD1 and CD2 from the first and second memory cells MC1 and MC2 by using the first and second sensing circuits 120_1 and 120_2, and may transmit the read first and second cell data CD1 and CD2 to the input/output sense amplifier 180e arranged in the peripheral region R_PERI.

The input/output sense amplifier 180e may receive a plurality of pieces of cell data CD1 through CDm, and may buffer the plurality of pieces of cell data CD1 through CDm or amplify voltage levels of the plurality of pieces of cell data CD1 through CDm and transmit the buffered cell data CD1 through CDm or the cell data CD1 through CDm having the amplified voltage levels to the data converting circuit 160e. The data converting circuit 160e may convert a plurality of pieces of cell data CD1 through CDm into a plurality of pieces of digital data BIT1 through BITn. The data converting circuit 160e may convert first and second cell data CD1 and CD2 into first through third bit data BIT1, BIT2, and BIT3. Accordingly, the number of pieces of the plurality of digital data BIT through BITn may be more than the number of pieces of the plurality of cell data CD1 through CDm. The data converting circuit 160e may transmit the plurality of pieces of cell data BIT through BITn to the input/output buffer 190e, and the input/output buffer 190e may output the plurality of pieces of digital data BIT through BITn as a plurality of pieces of read data D1 through Dn via a pad PAD.

Figure 18:
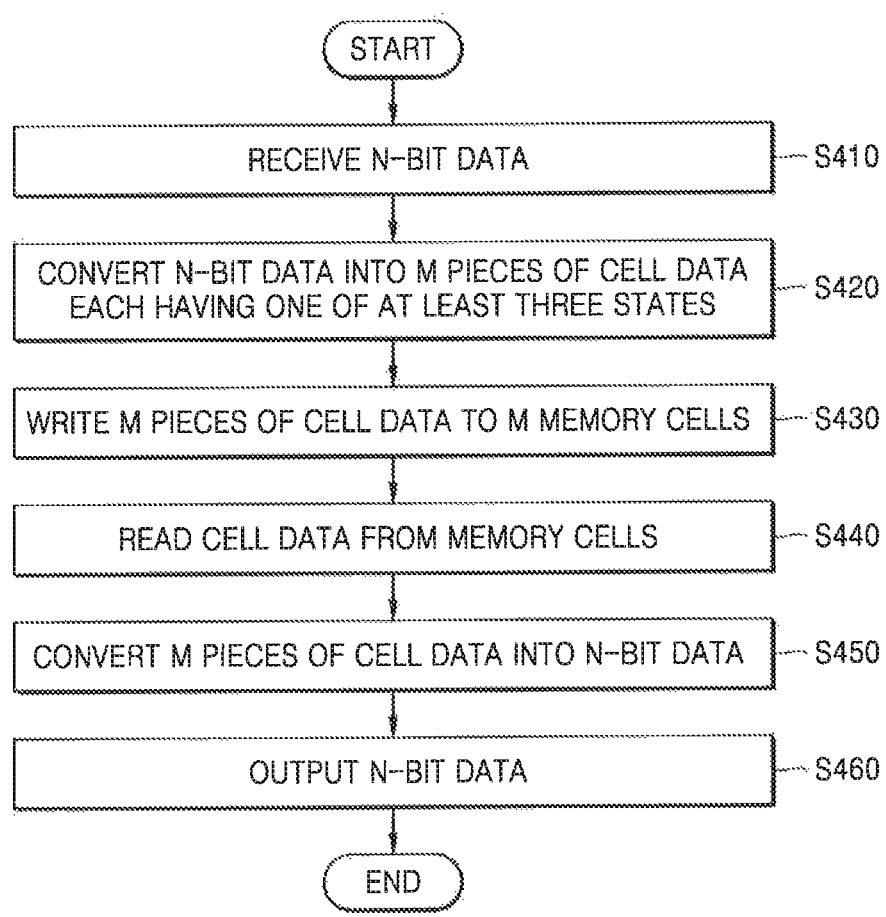
FIG. 18 is a flowchart of a method of operating a memory device according to an exemplary embodiment of the inventive concept.

FIG. 18 is a flowchart of a method of operating a memory device according to an exemplary embodiment of the inventive concept.

FIG. 18 describes a method of writing and reading data by using the memory devices according to the above-described exemplary embodiments of the inventive concept. Accordingly, a description provided above with reference to FIGS. 1 through 16 may also be applied to the method of operating a memory device according to the present exemplary embodiment.

Referring to FIG. 18, a memory device may receive N-bit data in operation S410, and convert the N-bit data into M pieces of cell data in operation S420. M may be a natural number equal to or greater than 2, and N may be a natural number greater than N, and cell data may have one of at least three states. According to an exemplary embodiment of the inventive concept, by converting three-bit data into two pieces of cell data, N-bit data may be converted into M pieces of cell data.

M pieces of cell data may be respectively written to M memory cells in operation S430. In other words, M pieces of cells data are written to corresponding M memory cells. According to operations S410 through S430, the memory device may store N-bit data in M memory cells.

Data is read from memory cells in the following way. First, cell data may be read from a memory cell in operation S440. Cell data may be read according to a reading method described with reference to FIGS. 1 through 10. Multi-level data, for example, cell data having one of three levels may be read by using a speed in a variation of a voltage level of a bit line according to a state of the cell data and amplifying characteristics of a bit line sense amplifier. Next, M pieces of cell data read from M memory cells may be converted into N-bit data in operation S450, and the N-bit data is output in operation S460. Here, by converting two pieces of cell data into three-bit data, M pieces of cell data may be converted into N-bit data. According to operations S440 through S460, the memory device may output N-bit data from the M memory cells.

Figure 19:
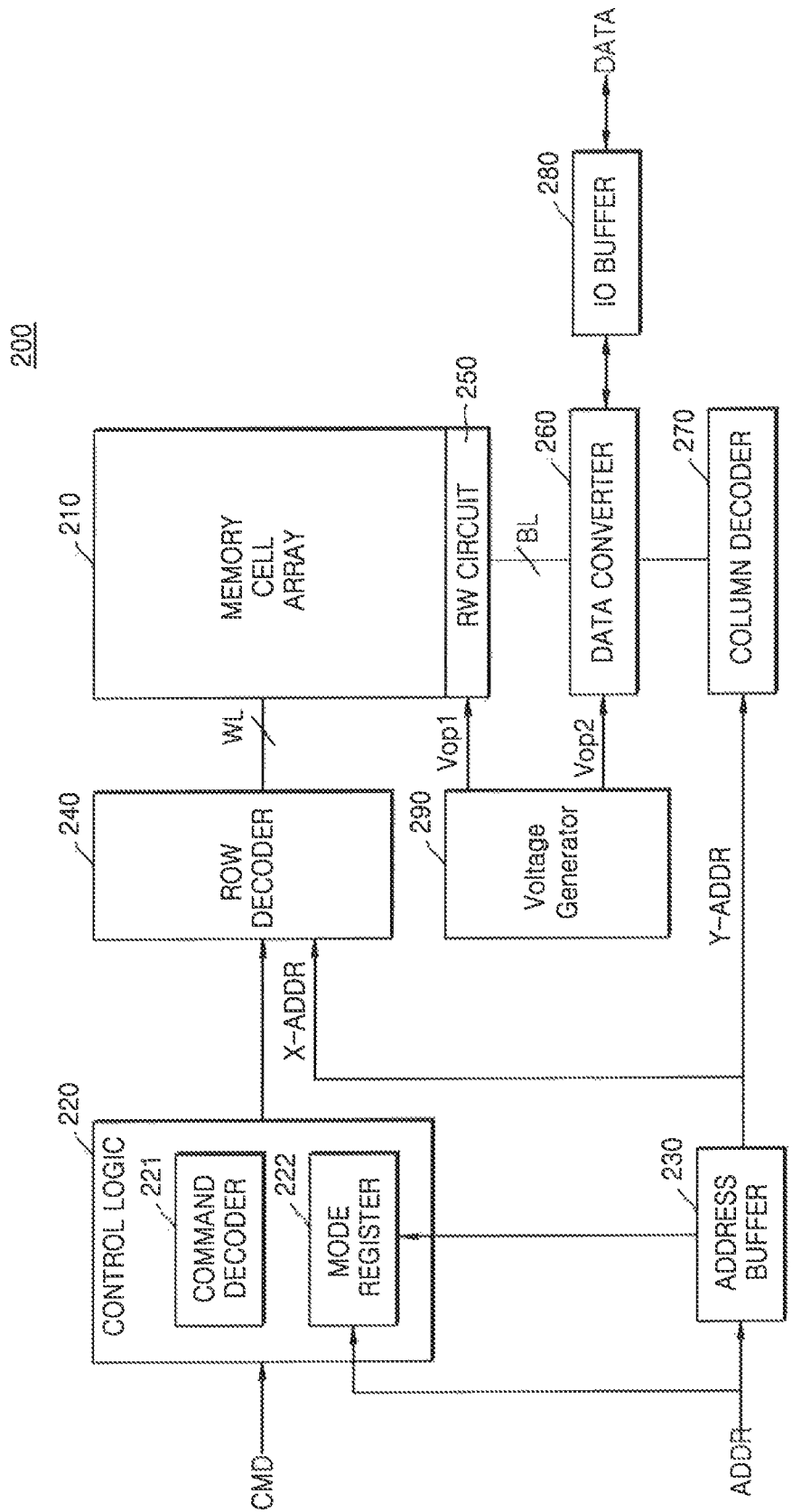
FIG. 19 is a block diagram illustrating a memory device according to an exemplary embodiment of the inventive concept.

FIG. 19 is a block diagram illustrating a memory device 200 according to an exemplary embodiment of the inventive concept.

Referring to FIG. 19, the memory device 200 may include a memory cell array 210, a write/read circuit 250, a data converting circuit 260, a control logic 220, an address buffer 230, and a voltage generator 290. The memory device 200 may further include a row decoder 240, a column decoder 270, and an input/output buffer 280.

The memory cell array 210 may include a plurality or memory cells arranged in regions where a plurality of bit lines BL and a plurality of word lines WL cross each other. The memory cells may be multi-bit cells for storing multi-level data having one of at least three states. According to an exemplary embodiment of the inventive concept, a plurality of memory cells may operate as a unit cell. For example, two memory cells may operate as a unit cell. Write and read operations may be simultaneously performed on memory cells included in a unit cell.

The control logic 220 may include a command decoder 221 and a mode register 222 and may control an overall operation of the memory device 200. The command decoder 221 may decode a command signal CMD received from the outside, for example, a chip select signal /CS, a row address strobe /RAS, a column address strobe /CAS, a write enable signal /WE, and a clock enable signal CKE, and internally generate a decoded command signal. The mode register 222 may set an internal register in response to a mode register signal and an address signal ADDR for designating an operation mode of the memory device 200.

The address buffer 230 may temporarily store an address signal ADDR received from the outside. Next, the address buffer 230 may transmit a row address X-ADD to the row decoder 240, and transmit a column address Y-ADDR to the column decoder 270.

The row decoder 240 and the column decoder 270 may include a plurality of switches. The row decoder 240 may select a word line WL in response to a row address, and the column decoder 270 may select a bit line BL in response to a column address.

The input/output buffer 280 may output data received from the data converting circuit 260 to the outside, or may provide the data converting circuit 260 with data received from the outside. According to exemplary embodiments of the inventive concept, the memory device 200 may further include an input/output sense amplifier connected to the data converting circuit 260 and the input/output buffer 280. The input/output sense amplifier may amplify a voltage level of data received from the data converting circuit 260 and transmit the data to the input/output buffer 280.

The data converting circuit 260 may convert input data received from the outside of the memory device 200 into cell data or may convert cell data read from the memory cell array 210 into output data that is output to the outside of the memory device 200. The input data and the output data may be digital data having one of two states, and cell data is multi-level data having one of at least three states. The data converting circuit 260 may convert N-bit digital data into M pieces of cell data (M is a natural number equal to or greater than 2, and N is a natural number greater than M).

The write/read circuit 250 may write cell data received from the data converting circuit 260 to a memory cell or read cell data from a memory cell and provide the read cell data to the data converting circuit 260. The write/read circuit 250 may write cell data to a memory cell by applying a voltage corresponding to a state of cell data to a bit line. In addition, the write/read circuit 250 may read cell data having multiple levels by using a speed in a variation of a voltage level of a bit line according to a state of the cell data stored in a memory cell and amplifying characteristics of a bit line sense amplifier.

The voltage generator 290 may generate various voltages used in the memory device 200. In particular, the voltage generator 290 may generate operation voltages Vop1 used in a write or read operation of the write/read circuit 250, for example, first through third power voltages VCC, VSS, and HVCC, a precharge voltage VBL, a first reference voltage VREF1 or a second reference voltage VREF2. The voltage generator 290 may generate operation voltages Vop2 used in the data converting circuit 260, for example, a first comparison voltage VCMP1, a second comparison voltage VCMP2, or a comparison voltage VCMP.

Figure 20:
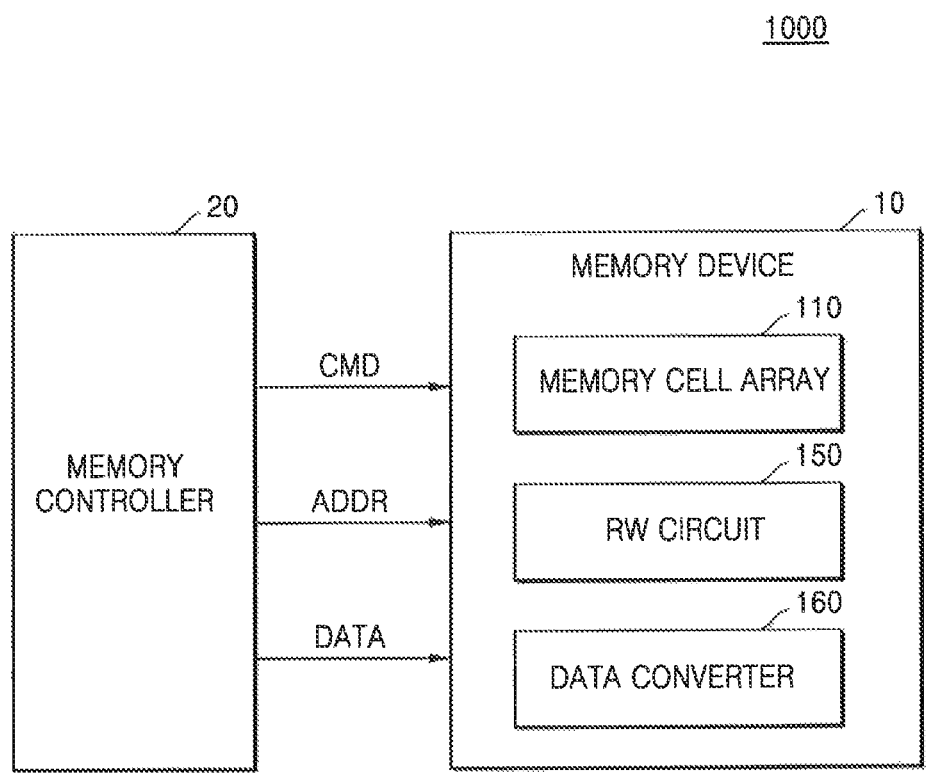
FIG. 20 is a block diagram illustrating a memory system according to an exemplary embodiment of the inventive concept.

FIG. 20 is a block diagram illustrating a memory system 1000 according to an exemplary embodiment of the inventive concept.

Referring to FIG. 20, the memory system 1000 may include a memory controller 20 and a semiconductor memory device 10.

The memory controller 20 may provide various signals for controlling the semiconductor memory device 10, for example, a command signal CMD and an address signal ADDR, to the semiconductor memory device 10. The memory controller 20 may transmit or receive data DATA to and from the semiconductor memory device 10.

The semiconductor memory device 10 may store data DATA in a memory cell array 110 or provide data stored in the memory cell array 110 to the memory controller 20, based on signals received from the memory controller 20.

A random access memory which requires a high processing speed may be included as the semiconductor memory device 10. As a random access memory, the semiconductor memory device 10 may include a dynamic random access memory (DRAM) cell. The semiconductor memory device 10 may be a DRAM chip including a DRAM cell. In addition, the semiconductor memory device 10 may include other random-accessible memory cells such as a magnetoresistive random access memory (MRAM) cell, a spin-transfer torque MRAM (STT-MRAM) cell, a phase-change random access memory (PRAM) cell, or a resistive random access memory (RRAM) cell.

The semiconductor memory device 10 may include the memory cell array 110, a write/read circuit 150, and a data converting circuit 160. The memory device 200 described with reference to FIG. 19 may be applied as the semiconductor memory device 10.

The memory cell array 110 may include a plurality of memory cells, and each memory cell may be a multi-level cell for storing at least multi-level data. Data DATA received from the memory controller 20 is N-bit digital data. The data converting circuit 160 may convert N-bit digital data into M pieces of cell data to be stored in memory cells. Cell data may have one of at least three states. The write/read circuit 150 may write M pieces of cell data to M memory cells. In addition, the write/read circuit 150 may read cell data from the memory cells, and the data converting circuit 160 may convert the read cell data into digital data. The data converting circuit 160 may convert M pieces of cell data into N-bit digital data. The semiconductor memory device 10 may transmit the N-bit digital data to the memory controller 20.

As described above, according to the memory system 1000 of the present exemplary embodiment, digital data may be transmitted or received between the memory controller 20 and the semiconductor memory device 10, and the semiconductor memory device 10 may write converted data, in other words, cell data, to a memory cell or read cell data from a memory cell via data conversion.

Figure 21:
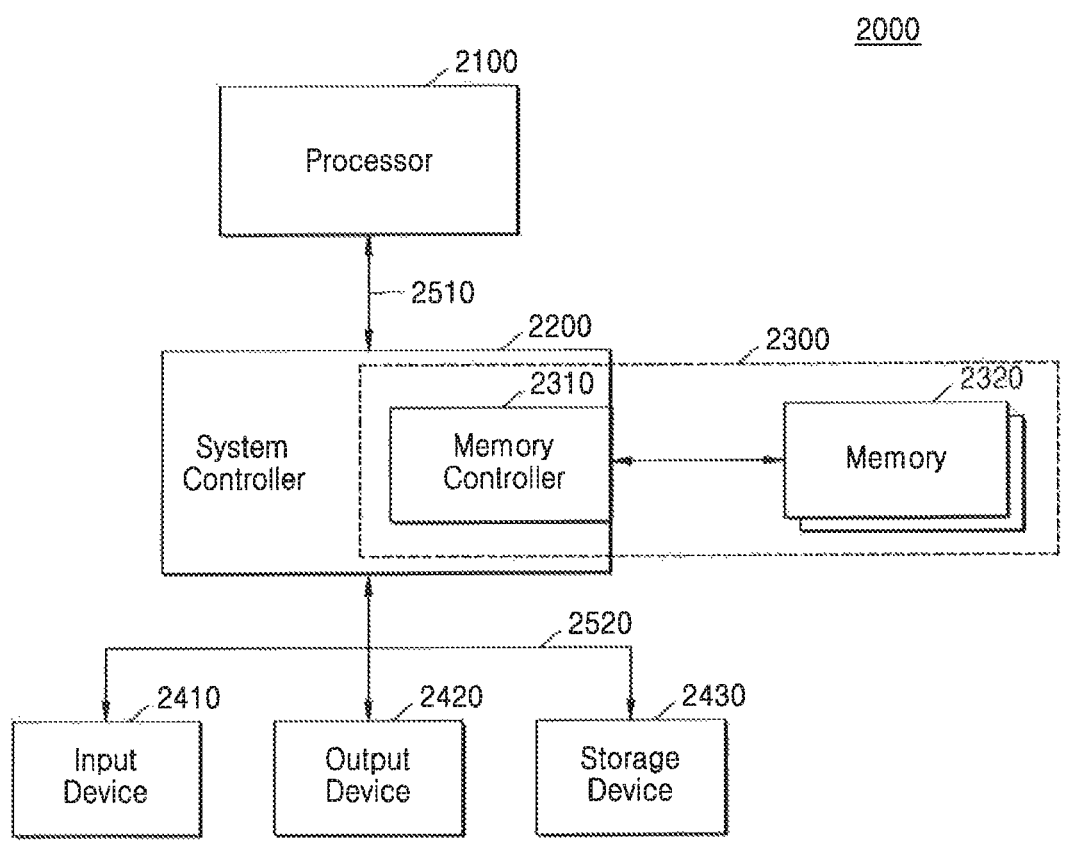
FIG. 21 is a block diagram illustrating a computer system including a memory controller according to an exemplary embodiment of the inventive concept.

FIG. 21 is a block diagram illustrating a computer system 2000 including a memory controller according to an exemplary embodiment of the inventive concept. Referring to FIG. 21, the computer system 2000 includes a processor 2100, a system controller 2200, and a memory system 2300. The computer system 2000 may further include a processor bus 2510, an extension bus 2520, an input device 2410, an output device 2420, and a storage device 2430. The memory system 2300 includes at least one semiconductor memory device 2320 and a memory controller 2310. The memory controller 2310 may be included in the system controller 2200.

The processor 2100 may execute various computing functions such as the execution of predetermined software for executing predetermined calculations or tasks. For example, the processor 2100 may be a microprocessor or a central processing unit. The processor 2100 may be connected to the system controller 2200 via the processor bus 2510 including an address bus, a control bus and/or a data bus. The system controller 2200 is connected to the extension bus 2520 such as a peripheral component interconnection (PCI). Accordingly, the processor 2100 may control at least one input device 2410 such as a keyboard or a mouse, at least one output device 2420 such as a display device, or at least one storage device 2430 such as a hard disk drive, a solid state drive or a compact disc read only memory (CD-ROM).

The memory controller 2310 may control the semiconductor memory device 2320 to perform a command provided by the processor 2100. The semiconductor memory device 2320 may store data received from the memory controller 2310, and provide the stored data to the memory controller 2310. The semiconductor memory device 2320 may generate cell data by converting the data received from the memory controller 2310, and store the cell data in a memory cell. In addition, the semiconductor memory device 2320 may read the cell data from the memory cell, and provide the converted data to the semiconductor memory device 2320. The semiconductor memory device 2320 may convert digital data having one of two states into cell data having one of at least three states or may convert the cell data into digital data.

The semiconductor memory device 2320 may include a plurality of memory chips such as a DRAM, an SRAM or a non-volatile memory chip.

The computer system 2000 may be, for example, a desktop computer, a notebook computer, a work station, or a hand-held device.

Figure 22:
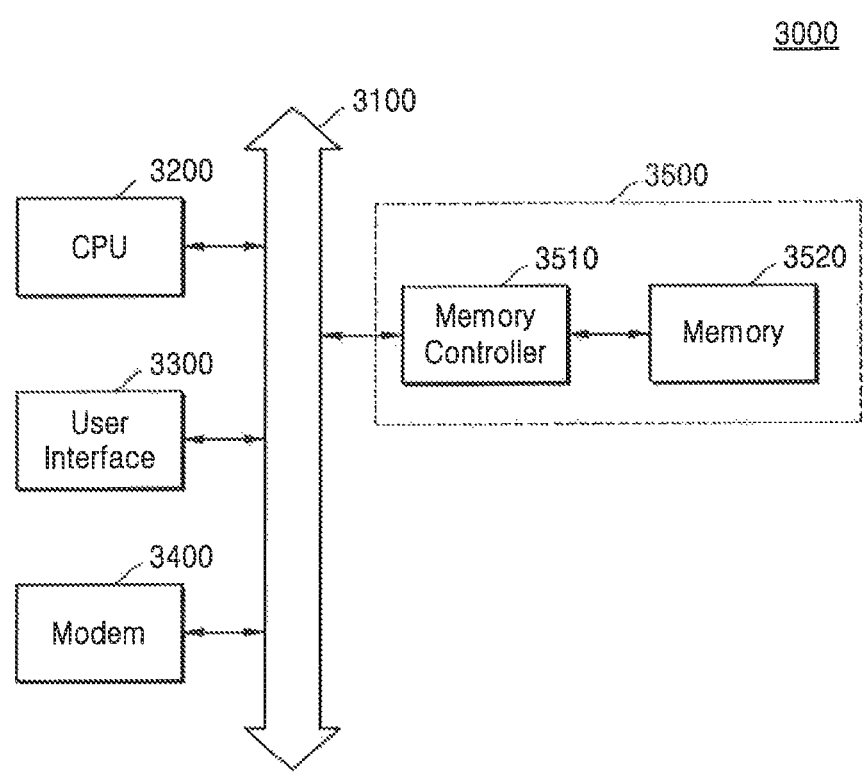
FIG. 22 is a block diagram illustrating a computer system including a memory controller according to an exemplary embodiment of the inventive concept.

FIG. 22 is a block diagram illustrating a computer system 3000 including a memory controller according to an exemplary embodiment of the inventive concept. Referring to FIG. 22, the computer system 3000 may include a central processing unit 3200, a user interface 3300, a modem 3400, and a memory system 3500 that are electrically connected to a system bus 3100. A semiconductor memory device 3520 included in the memory system 3500 may include a non-volatile memory cell such as a DRAM cell or a non-volatile memory cell such as an STT-MRAM cell.

The memory system 3500 may include the semiconductor memory device 3520 and a memory controller 3510. In the semiconductor memory device 3520, data processed by the central processing unit 3200 or data received from the outside may be stored.

The semiconductor memory device 3520 may be used as a storage for storing large-capacity data in the computer system 3000 or a main memory for storing data requiring fast access, such as system data. The semiconductor memory device 3520 may convert N-bit digital data received from the memory controller 3510 into M pieces of cell data (M is a natural number equal to or greater than 2, and N is a natural number greater than M), and may store the M pieces of cell data in M memory cells. In addition, the semiconductor memory device 3520 may read cell data from a memory cell, convert the cell data, and provide the converted data to the memory controller 3510. An application chipset, a camera image processor (e.g., CMOS image sensor (CIS)), an input/output device or the like may be further included in the computer system 3000.

Figure 23A:
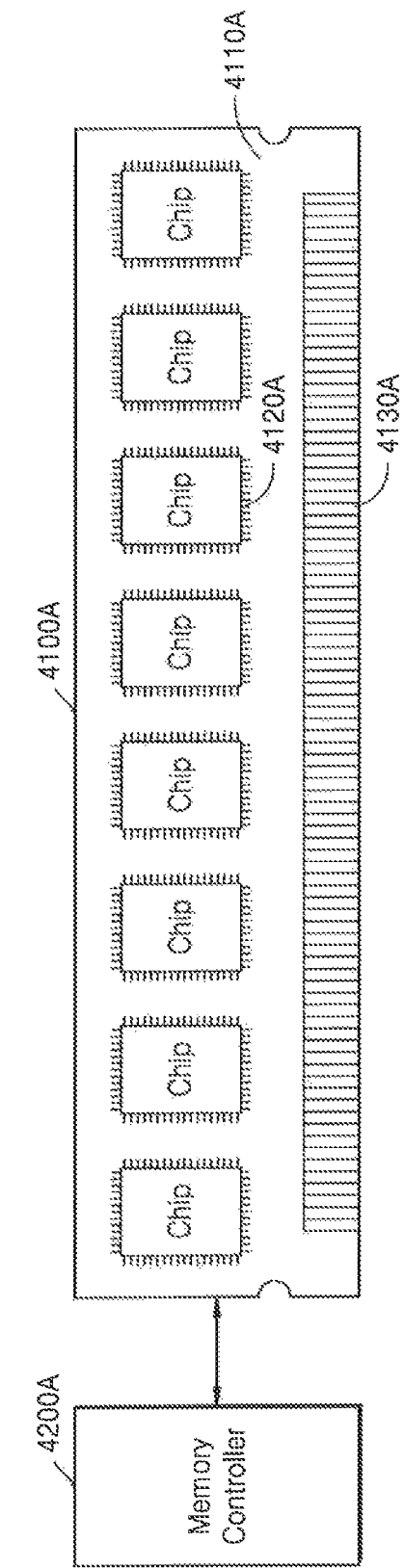
FIGS. 23A and 23B are block diagrams illustrating a memory controller and a memory module according to an exemplary embodiment of the inventive concept.
Figure 23B:
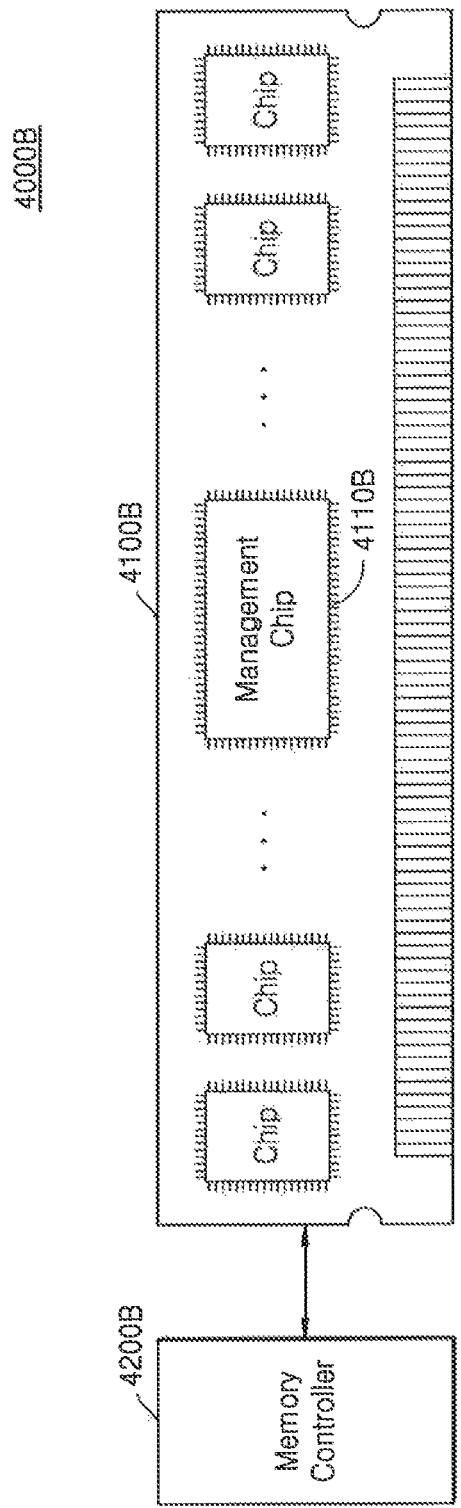

FIGS. 23A and 23B are block diagrams illustrating a memory controller and a memory module according to an exemplary embodiment of the inventive concept.

Referring to FIG. 23A, a memory system 4000a includes a memory module 4100a and a memory controller 4200a. The memory module 4100a includes a printed circuit board 4110a, a plurality of memory chips 4120a, and a connector 4130a. The plurality of memory chips 4120a may be coupled to upper and lower surfaces of the printed circuit board 4110a. The connector 4130a is electrically connected to the plurality of memory chips 4120a via conductor wires. In addition, the connector 4130a may be connected to a slot of an external host.

The plurality of memory chips 4120a may include a volatile memory such as a DRAM cell or a non-volatile memory cell such as an STT-MRAM cell. The memory chips 4120a may store data of the memory system 4000a in a short term or temporarily like an operation memory or a cache memory. The memory controller 4200a may queue a command or perform an operation of detecting a defect corresponding to a command, in parallel to an operation of outputting a command. In the memory system 4000a, a DRAM interface may be applied between the memory controller 4200a and the memory module 4100a.

In the memory system 4000a of FIG. 23A, the memory controller 4200a is illustrated as being separately included from the memory module 4100a, but the memory controller 4200a may also be included in the memory module 4100a. The memory controller 4200a may be coupled to an upper or lower surface of the printed circuit board 4110a, and may communicate with the memory chips 4120a via conductor wires.

Further, as illustrated in FIG. 23B, a memory system 4000b includes a memory module 4100b and a memory controller 4200b, and the memory module 4100b may include at least one semiconductor chip each including a cell array and a management chip 4110b for managing a memory operation on the cell array. Some of functions of the memory controller 4200b may be performed in the management chip 4110b.

While FIG. 23B illustrates that some of functions of the memory controller are performed in a load-reduced dual in-line memory module (LRDIMM)-type memory module, the inventive concept is not limited thereto. For example, when a fully buffered dual in-line memory module (FB-DIMM)-type memory module is used, an Advanced Memory Buffer chip may be mounted as a management chip in the memory module 4100B. In addition, a memory module of another type may be used, and the at least some of functions of the memory controller 4200B may be performed in the memory module.

While the inventive concept has been particularly shown and described with reference to exemplary embodiments thereof, it will be understood that various changes in form and details may be made therein without departing from the spirit and scope of the inventive concept as defined by the following claims.

What is claimed is:

1. A method of operating a memory device, the method comprising:
    writing cell data having one of three states to a memory cell;
    amplifying a voltage level of a bit line connected to the memory cell;
    determining that the cell data is in a first state when the voltage level of the bit line is amplified to equal to or greater than a first reference voltage during a sensing period;
    determining that the cell data is in a second state when the voltage level of the bit line is amplified to equal to or less than a second reference voltage lower than the first reference voltage during the sensing period; and
    determining that the cell data is in a third state when the cell data is not determined to be in one of the first state and the second state during the sensing period.

2. The method of claim 1, wherein the third state is between the first state and the second state.

3. The method of claim 1, further comprising applying a first voltage to the bit line when the cell data is in the third state.

4. The method of claim 3, further comprising applying a precharge voltage to the bit line before amplifying the voltage level of the bit line,
    wherein the first voltage is the precharge voltage.

5. The method of claim 1, further comprising sensing the voltage level of the bit line by comparing at a sensing point the voltage level of the bit line with each of the first reference voltage and the second reference voltage.

6. The method of claim 1, wherein the voltage level of the bit line connected to the memory cell is amplified with a sense amplifier connected to the bit line, and at least one voltage level of the first reference voltage and the second reference voltage corresponds to a threshold voltage level used by the sense amplifier to perform the amplifying.

7. The method of claim 1, further comprising stopping the amplifying when the cell data is in the third state.

8. The method of claim 1, further comprising, after determining the state of the cell data, outputting the voltage level of the bit line as cell data read from the memory cell.

9. The method of claim 8, further comprising converting the output cell data having one of three states into digital data having one of two states.

10. The method of claim 1, further comprising converting M pieces of cell data (M is a natural number equal to or greater than 2) which are read from M memory cells, into N-bit digital data (N is a natural number greater than M).

11. The method of claim 10, wherein the converting comprises generating three-bit digital data based on a first piece of the M pieces of cell data and a second piece of the M pieces of cell data.

12. The method of claim 1, further comprising, before writing the cell data, converting N-bit digital data received from outside of the memory device into M pieces of cell data (M is a natural number equal to or greater than 2, and N is a natural number greater than M).

13. The method of claim 1, wherein the memory cell comprises a capacitor and a switching element.

14. A method of operating a memory device, the method comprising:
    writing cell data to a memory cell;
    amplifying a voltage level of a bit line connected to the memory cell; and
    sensing the voltage level of the bit line,
    wherein when the sensed voltage level is greater than a first reference voltage, the cell data is in a first state, when the sensed voltage level is less than a second reference voltage, the cell data is in a second state, and when the sensed voltage level is between the first and second reference voltages, the cell data is in a third state.

15. The method of claim 14, wherein the first state is a high state, the second state is a low state and the third state is between the first and second states.

16. The method of claim 14, wherein the first state is represented as '1', the second state is represented as '0', and the third state is represented as 'X'.

* * * * *